US009154982B2

(12) United States Patent
Chan et al.

(10) Patent No.: US 9,154,982 B2
(45) Date of Patent: Oct. 6, 2015

(54) METHOD AND SYSTEM FOR A TRAFFIC MANAGEMENT NETWORK

(75) Inventors: Peter Chan, Lily Lake, IL (US); Roland Ho, Buffalo Grove, IL (US); Yunfeng Liu, Madison, WI (US)

(73) Assignee: TRAFFICCAST INTERNATIONAL, INC., Madison, WI (US)

( * ) Notice: Subject to any disclaimer, the term of this patent is extended or adjusted under 35 U.S.C. 154(b) by 450 days.

(21) Appl. No.: 13/584,141

(22) Filed: Aug. 13, 2012

(65) Prior Publication Data

US 2012/0307676 A1  Dec. 6, 2012

Related U.S. Application Data

(63) Continuation-in-part of application No. 12/752,778, filed on Apr. 1, 2010, now Pat. No. 8,510,025.

(60) Provisional application No. 61/211,702, filed on Apr. 2, 2009.

(51) Int. Cl.
*G06F 19/00* (2011.01)
*H04W 24/08* (2009.01)
*H04L 12/26* (2006.01)
*G08G 1/0962* (2006.01)
*H04L 7/00* (2006.01)
*G01P 3/36* (2006.01)
*G01C 21/26* (2006.01)
(Continued)

(52) U.S. Cl.
CPC .............. *H04W 24/08* (2013.01); *H04L 43/18* (2013.01); *G01C 21/26* (2013.01); *G01P 3/36* (2013.01); *G01R 31/08* (2013.01); *G08G 1/00* (2013.01); *G08G 1/0962* (2013.01); *H04L 7/00* (2013.01)

(58) Field of Classification Search
CPC ....... G06F 19/00; G06F 17/00; G08G 1/0104; G08G 1/01; G08G 1/0967; G08G 1/0962; G08G 1/00; G06G 7/76; H04B 17/00; G01C 21/26; H04Q 7/22; G01R 31/08; H04L 43/18; H04L 7/00; H04W 24/08; G01P 3/36
See application file for complete search history.

(56) References Cited

U.S. PATENT DOCUMENTS 6,131,064 A * 10/2000 Vieweg ......................... 701/117
6,466,862 B1 * 10/2002 DeKock et al. ................ 701/117
6,505,114 B2   1/2003 Luciani
(Continued)

FOREIGN PATENT DOCUMENTS

WO    WO 2011/134647    11/2011

OTHER PUBLICATIONS

Examination Report on New Zealand Application 596146, mailed Dec. 24, 2013.
(Continued)

*Primary Examiner* — Behrang Badii
(74) *Attorney, Agent, or Firm* — Foley & Lardner LLP

(57) ABSTRACT

A system for collecting traffic information that includes at least one first mobile node; at least one second mobile node; at least one data collection node; and a central processing station. At least one packet is transmitted between the first mobile node and the second node. The data collection node includes a packet search analyzer to determine an identifier that identifiers the first mobile node or the second mobile node from the at least one packet. The central processing station is linked to the data collection node and communicates traffic information associated with the identifier.

17 Claims, 14 Drawing Sheets

(51) Int. Cl.
*G08G 1/00* (2006.01)
*G01R 31/08* (2006.01)

(56) References Cited

U.S. PATENT DOCUMENTS

| | | | |
|---|---|---|---|
| 6,711,493 | B1 | 3/2004 | Andrews et al. |
| 6,785,606 | B2 | 8/2004 | DeKock |
| 7,979,198 | B1* | 7/2011 | Kim et al. ............... 701/117 |
| 2002/0085498 | A1 | 7/2002 | Nakamichi et al. |
| 2003/0187571 | A1* | 10/2003 | Impson et al. ........... 701/117 |
| 2004/0147223 | A1 | 7/2004 | Cho |
| 2007/0142037 | A1* | 6/2007 | O'Toole et al. ........ 455/414.1 |
| 2007/0257782 | A1 | 11/2007 | Etcheson |
| 2008/0026771 | A1 | 1/2008 | Hill |
| 2008/0059050 | A1* | 3/2008 | Lin et al. ............... 701/117 |
| 2009/0112452 | A1 | 4/2009 | Buck et al. |
| 2009/0210141 | A1 | 8/2009 | Young et al. |
| 2009/0271100 | A1 | 10/2009 | Kim et al. |
| 2009/0309966 | A1 | 12/2009 | Chen et al. |
| 2010/0004849 | A1 | 1/2010 | Jeong |
| 2010/0203834 | A1 | 8/2010 | Bragagnini et al. |
| 2011/0156924 | A1 | 6/2011 | Nadeem et al. |
| 2013/0006510 | A1* | 1/2013 | Young et al. ............ 701/119 |

OTHER PUBLICATIONS

Sugiura, Akihika, et al., "In Traffic Jam IVC-RVC System for ITS Using Bluetooth," IEEE Transactions on Intelligent Transportation Systems, vol. 6, No. 3, Sep. 2005, pp. 302-313.
"Bluetooth Traffic Monitoring Technology—Concept of Operation and Deployment Guidelines", Sep. 17, 2008, pp. 1-5, University of Maryland—Center for Advanced Transportation Technology.
"Concept of Operations", Traffax Inc., pp. 1-2, downloaded Mar. 16, 2009 via http://www.traffaxinc.com/concept.html.
"Product Description", Traffax, Inc., pp. 1-2, downloaded Mar. 16, 2009 via http://traffaxinc.com/product.html.
"Product Types", Traffax, Inc., pp. 1-2, downloaded Mar. 16, 2009 via http://www.traffaxinc.com/types.html.
"Traffax Inc. Introduces a Unique Line of Data Collection Equipment", Traffax Press Release, pp. 1-3, Feb. 9, 2009.
Tarnoff, Philip J. et al., "The Continuing Evolution of Travel Time Data Information Collection and Processing", TRB Paper 09-2030, Jul. 31, 2008, pp. 1-14, Center for Advanced Transportation Technology.
International Preliminary Report on Patentability for Intl. Pat. Appln. No. PCT/US2010/029757, mailed on Oct. 13, 2011, 6 pp.
International Search Report and Written Opinion for Intl. Pat. Appln. No. PCT/US2010/029757, mailed on Oct. 26, 2010, and received on Nov. 4, 2010.
First Office Action on Chinese Application 201080022468.0, mailed Feb. 11, 2014.
Examination Report issued on Australian Patent Application 2010232549, mailed Jul. 25, 2014.
Notice of Allowance on U.S. Appl. No. 12/752,778, mailed May 14, 2013.
Non-Final Office Action on U.S. Appl. No. 12/752,778, mailed Jan. 29, 2013.
Examination Report on New Zealand Application 596146, mailed Apr. 29, 2014.
Second Examination Report on Australian Application 2010232549, mailed Apr. 30, 2015.

* cited by examiner

METHOD AND SYSTEM FOR A TRAFFIC MANAGEMENT NETWORK

CROSS-REFERENCE TO RELATED PATENT APPLICATIONS

This application is a continuation-in-part of U.S. application Ser. No. 12/752,778, filed Apr. 1, 2010, which claims priority from Provisional Application No. 61/211,702, filed Apr. 2, 2009, each of which is incorporated herein by reference in its entirety.

BACKGROUND

The field of the disclosure relates generally to traffic management systems. More specifically, the disclosure relates to a traffic management system that collects information using a network.

Currently, various types of information service providers (ISPs) provide traffic information to users. The various types of ISPs include traffic and map systems such as Westwood One, Traffic.com/Navteq, Clear Channel Traffic; portal systems such as Yahoo!, Google, MapQuest/AOL, MicroSoft MSN; wireless carriers such as Verizon Wireless, Cingular Wireless, Sprint Nextel, T-Mobile; telematics and navigation systems—GM OnStar, Ford, Toyota, XM Satellite Radio, Sirius Satellite Radio, Garmin, TomTom, Magellen, Motorola, AAA; and media companies such as NBC, ABC, CBS, etc. With the improvement in the quality and the granularity of traffic and travel time information, ISPs attempt to provide route-specific travel time information and dynamic route guidance information to individual users to influence the individual's travel choices including departure time, arrival time, route, destination, etc. An individual traveler relies on the ISP's information and personal experiences and preferences to make individual decisions for their travel choices.

As ISPs provide route-specific travel time information and dynamic route guidance information to more and more individual users, market penetration of actionable traffic information services may increase rapidly. As this type of actionable traffic information provision market penetration reaches a critical threshold, users with similar traffic and travel time information may compete for the shortest travel time routes creating new congestion for these routes. For example, users in the San Francisco Bay Area typically choose US 101 to travel from San Francisco to San Jose. When severe congestion occurs on US 101, for example, due to a major traffic accident, many ISPs advise motorists to use alternate routes I-280 or El Camino Real to avoid major congestion on US 101. However, with the diversion of a large number of users from US 101 to I-280 or El Camino Real these routes quickly become congested.

In order to populate these systems, large amounts of traffic data need to be collected. The traffic and travel time information can also be used for traffic studies, for monitoring traffic flow, or for detecting accidents. However, it is expensive to collect the traffic information. Traffic information is typically collected by closed-circuit video cameras, observers or by axle counters. Video cameras can be used by employees to determine general traffic flow and detect problems like accidents. However, closed-circuit video systems are expensive to maintain and operate. Observer based studies are comprehensive but expensive to conduct over long periods. Axle counters can be deployed for long periods, but the counters must be collected for processing, Moreover, using current detection methods, travel times are inferred from speed detections which themselves are often derived from vehicle counts, yielding errors of up to 35-40%. Thus, improved systems and methods for collecting traffic data are needed.

SUMMARY

A representative embodiment relates to a system for collecting vehicular traffic data. The system for collecting vehicular traffic data includes at least one first node, at least one second node, and a central processing station. The first node includes a cellular communications module and a first networking communications module connected to a first processor. The second node includes a second networking communications module and a device detection module connected to a second processor. The at least one first node and the at least one second node form a network. The device detection module detects devices associated with vehicular traffic. The central processing station can be linked to the at least one first node via the cellular communications module. The at least one second node communicates information associated with the devices associated with traffic to the at least one first node. The at least one first node communicates the information associated with the devices associated with traffic to the cellular communications module.

Another representative embodiment relates to an apparatus for collecting traffic data. The apparatus includes a cellular communications module, a networking communications module, and a device detection module connected to a processor. The device detection module detects devices associated with traffic. The networking communications module communicates information associated with the devices associated with traffic to a central processing station.

BRIEF DESCRIPTION

DETAILED DESCRIPTION

A method, system, and apparatus for a traffic management network are described. In the following description, for purposes of explanation, numerous specific details are set forth to provide a thorough understanding of representative embodiments of the invention. It will be evident, however, to one skilled in the art that the invention may be practiced without these specific details. The drawings are not to scale. In other instances, well-known structures and devices are shown in simplified form to facilitate description of the exemplary embodiments.

Traffic Data Collection Node

Figure 1:
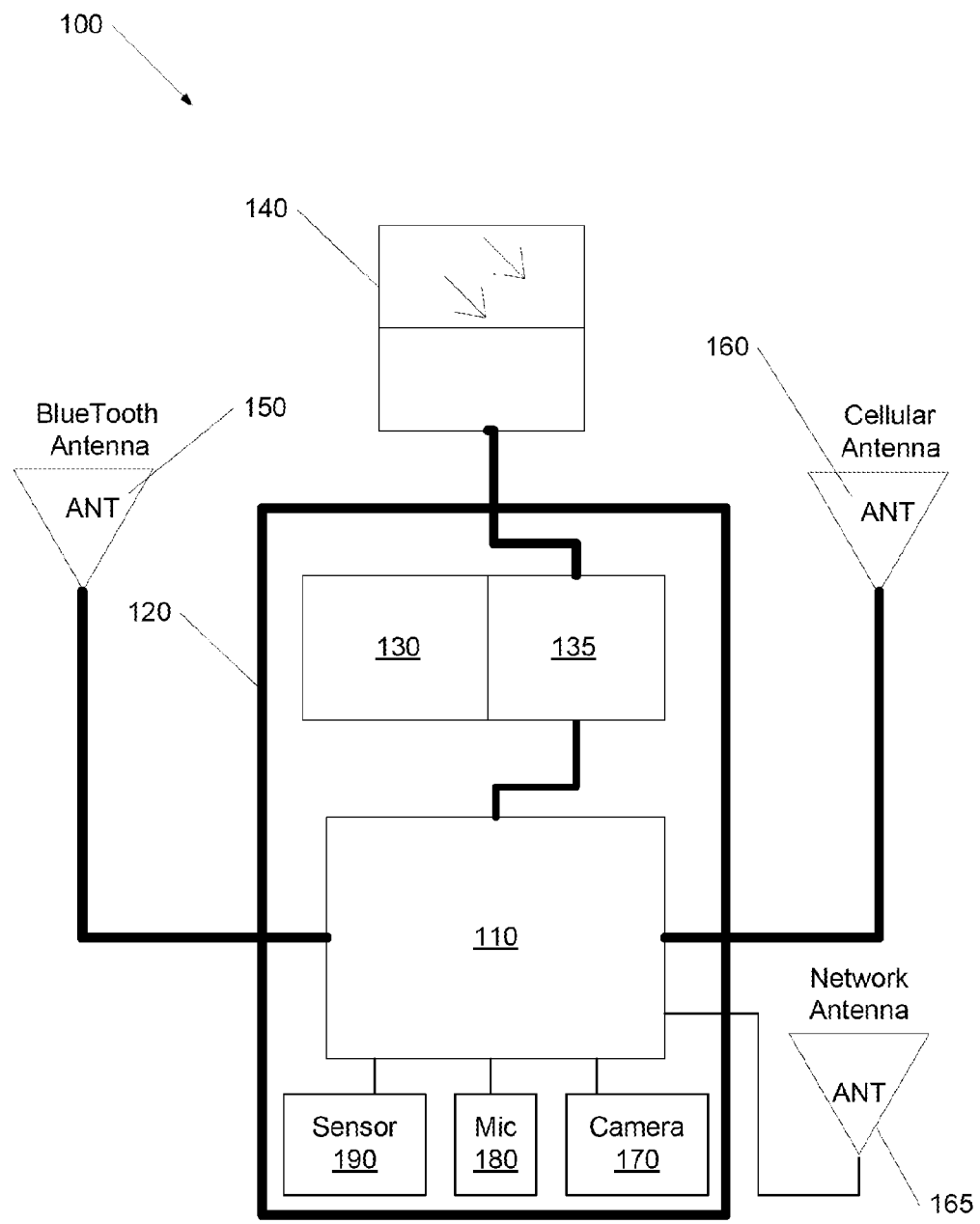
FIG. 1 is a diagram of a traffic data collection node in accordance with a representative embodiment.

Referring to FIG. 1, a diagram of a traffic data collection node 100 in accordance with a representative embodiment is shown. The traffic data collection node 100 includes a computing module 110, an energy storage device 130, an energy controller 135, a solar panel 140, a Bluetooth antenna 150, a cellular antenna 160, and a network antenna 165. The traffic data collection node 100 can also optionally include a camera 170, a microphone 180, and a sensor 190. The computing module 110, energy storage device 130, and energy controller 130 are contained in a protective enclosure 120.

The protective enclosure 120 can be a weatherproof fiberglass enclosure, for instance, a NEMA-4 rated enclosure. Other materials such as steel, plastic, or carbon fiber can be used. Some or all of the components, including the antennas, can be enclosed in the protective enclosure 120. The protective enclosure 120 can also include a mount for attaching the traffic data collection node 100 to telephone poles, road signs, barriers, etc.

In at least one embodiment, the traffic data collection node 100 can be about the size of a brick, or smaller. The traffic data collection node 100 can be deployed temporarily or permanently. The traffic data collection node 100 should be placed within radio frequency (RF) proximity of the travel stream of the devices to be detected. Hence, the traffic data collection node 100 can be attached to any existing structure, pole, or strut. The traffic data collection node 100 can be placed directly on the ground, behind guardrails, or mounted to a post. Placement of the traffic data collection node 100 is limited only by practical concerns of safety and security of roadside equipment.

The computing module 110 can be a printed circuit board including processors, memory, input/output modules, hard disk drives, solid state drives, flash memory, transmitters, receivers, controllers, integrated antennas, and slots. The slots can be used to add upgrade modules or other features such as detectors, machine vision processors, and speakers. The computing module 110 can have varying degrees of integration.

Energy storage device 130 and solar panel 140 provide power to the traffic data collection node 100. Energy controller 135 controls recharging of the energy storage device 130 by solar panel 140; and regulates power to the computing module 110 and other components of the traffic data collection node 100. The energy storage device 130 can be a battery, for example a 12V, 20-30 aH lithium ion battery. However, the energy storage device 130 can also be a capacitor, fuel cell, or other energy storage device. Alternatively, power can be provided by a hardwired connection. The solar panel 140 can be of various types and wattages, for example a 5 W or 10 W array.

The optional camera 170 can be color, black and white, or infra-red. The camera can be used, for example, to take a snapshot or video of traffic. The optional camera 170 can also include machine vision capabilities such the ability to identify and/or count objects. For example, the camera 170 could be used to identify license plates, a particular license plate, or a particular person. The optional camera 170 can also be programmed to detect traffic jams and accidents. Likewise, the microphone 180 can be used to detect traffic volume, noise pollution levels, or noise level offenders.

The sensor 190 can be a light sensor, inductance sensor, temperature sensor, a global positioning system (GPS) module, biological/nuclear materials sensor or any other kind of sensor. The sensor 190 can also be more than one or an array of sensors. The sensor 190 can be part of a larger grid of sensors used to monitor weather, temperatures in a city, carbon monoxide levels, detect the threat of a biological materials release, or to detect or monitor the transport of other hazardous materials.

The Bluetooth antenna 150, cellular antenna 160, and network antenna 165 are antennas designed to transmit and receive signals for their corresponding technologies. The cellular antenna 160 can be adapted to communicate with any cellular network. The network antenna 165 is used to connect the traffic data collection node 100 to a network of traffic data collection nodes. For example, the network antenna 165 can be coupled to a ZigBee-type (IEEE 802.15.4) communications module. However, multiple antennas, other antennas, or other communications schemes can be employed. For example, a satellite transmitter or receiver could be included. Additionally, a wired network or communications link can be included, such as an Ethernet connection.

The traffic data collection node 100 can also include hardware (e.g., Bluetooth antenna 150 and network antenna 165) and software configured to connect the traffic data collection node 100 to various networks such as a mobile ad hoc network, a vehicular ad hoc network, an intelligent vehicular ad hoc network, or an internet-based mobile ad-hoc network. A mobile ad hoc network (MANET), sometimes called a mobile mesh network, can be a self-configuring network of mobile devices connected by wireless links. A vehicular ad hoc network (VANETs) can be used for communication among vehicles and between vehicles and roadside equipment. An intelligent vehicular ad hoc network (InVANETs) includes artificial intelligence that helps vehicles to behave in intelligent manners during vehicle-to-vehicle collisions, accidents, drunken driving etc. Internet-based mobile ad hoc networks (iMANET) are MANETs that configure themselves over internet connections, for example, using a cellular network (e.g. using cellular antenna 160) internet connection. Thus, the traffic data collection node 100 can be part of various network configurations. In one illustrative embodiment, the traffic data collection node 100 can collect information about other nodes, devices, vehicles, etc. that are networked with the traffic data collection node 100. Alternatively, nodes of the traffic management network can be connected by a hard line such as an Ethernet cable.

The traffic data collection node 100 can include an embedded system architecture including custom embedded hardware design coupled with firmware. The traffic data collection node 100 detects Bluetooth devices via the Bluetooth antenna 150 (for example, ver 2.1/2.0/1.2/1.1 and class1/2) of vehicles and pedestrians to provide real-time traffic flow to a central processing center. The traffic data collection node 100 anonymously discovers Bluetooth Media Access Control (MAC) addresses, which serve as a unique identifier to a Bluetooth device.

A MAC address is a unique identifier assigned to a network adapter by its manufacturer for identification. MAC addresses are anonymous identifiers. MAC addresses are not associated with any specific user account (as is the case with cell phone probes) or any specific vehicle (as with automated toll tags). The MAC address is not linked to a specific person through any type of central database but is assigned at the Bluetooth electronic chip manufacturer. Additionally, it is difficult to match a MAC address to the purchase of a device by a consumer. The traffic management network, thus minimizes, if not eliminates privacy concerns. In general, users concerned with privacy can set options in their Bluetooth device (often under "Discovery Mode" or 'Visibility') to ensure that the device will not be detectable.

After discovering a MAC address, the traffic data collection node 100 places an associated time stamp on the discovered Bluetooth MAC addresses and stores the MAC addresses with time stamps in non-volatile memory. The data can then be sent to a central processing center using a packet-based cellular modem via the cellular antenna 160. The data can also be passed through a wireless mesh based network via the network antenna 165, where a central node collects data from a mesh network of traffic data collection nodes. A central traffic data collection node can then pass the data to a central processing center.

In addition, the traffic data collection node 100 can detect a signal strength of a signal associated with the MAC address. The traffic data collection node 100 can use multiple signal strength measurements to determine the speed and direction of the device associated with the MAC address. Alternatively, the traffic data collection node 100 can collect signal strength data and send it to another device for further processing. In particular, node 100 can detect a received signal strength indicator (RSSI), a generic radio receiver technology metric. The traffic data collection node 100 can determine the relative RSSI of the various radio signals it detects.

In order to reduce costs and power usage, various implementations of the traffic data collection node are possible. For example, some traffic data collection nodes only require basic features. For example, endpoint node devices could potentially become very simple devices that contain only a Bluetooth radio and a ZigBee radio. The 8-bit microcontroller (used to house the ZigBee stack) that is built into the ZigBee radio can be used as a controller thereby replacing the ARM7 microcontroller in a standard traffic data collection node. A simplified traffic data collection node can utilize a smaller solar panel and battery subsystem. Alternatively, the simplified traffic data collection node could rely solely on solar power. Advantageously, the size and cost of a traffic data collection node can be reduced. The simplified traffic data collection node can also serve as temporary, portable, low cost node.

Figure 2:
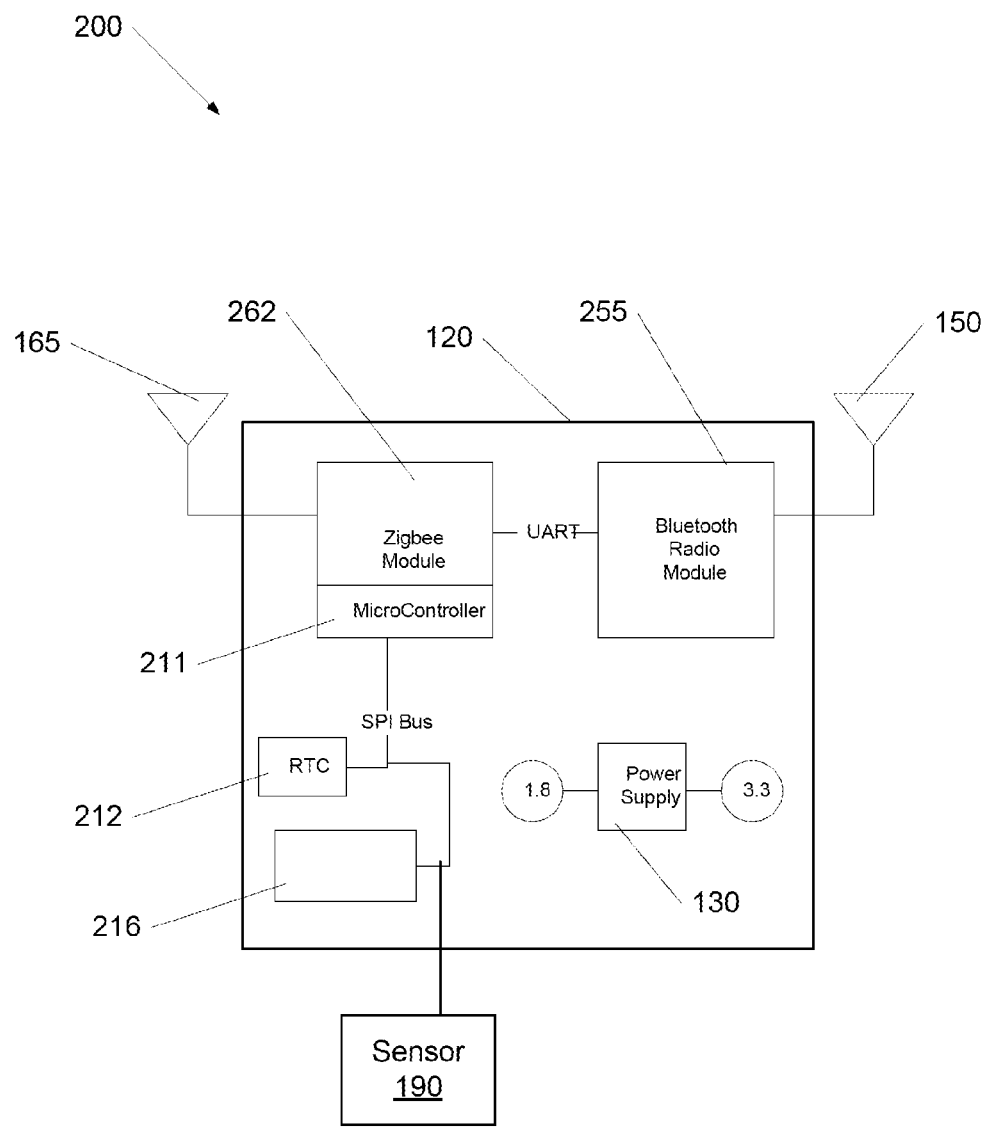
FIG. 2 is a diagram of a simplified traffic data collection node in accordance with a representative embodiment.

Referring to FIG. 2, a diagram of a simplified traffic data collection node 200 in accordance with a representative embodiment is shown. The simplified traffic data collection node 200 can be, for instance, used as an end-node in a traffic data collection network. The simplified traffic data collection node 200 includes a microcontroller 210, a real-time clock 212, a memory card 216, an energy storage device 130, a Bluetooth module 255, a Bluetooth antenna 150, a network module 262, and a network antenna 165. The simplified traffic data collection node 200 can also optionally include a sensor 190. The microcontroller 210, real-time clock 212, memory card 216, energy storage device 130, Bluetooth module 255, Bluetooth antenna 150, network module 262, and network antenna 165 are contained in a protective enclosure 120.

The microcontroller 210, real-time clock 212, memory card 216, energy storage device 130, Bluetooth module 255, Bluetooth antenna 150, network module 262, and network antenna 165 can be integrated onto a single printed circuit board including processors, memory, flash memory, transmitters, receivers, controllers, integrated antennas, and slots. The slots can be used to add upgrade modules or other features such as detectors, machine vision processors, and speakers. The simplified traffic data collection node 200 can have varying degrees of integration. For example, the microcontroller 210 and network module 262 can be integrated into the same integrated circuit.

The energy storage device 130 can be a battery, for example a 12V, 20-30 aH lithium ion battery. The energy storage device 130 can also include a power supply controller that divides the voltage, for example to 1.8 V and 3.3 V. The simplified traffic data collection node 200 is a low power implementation that can operate using the same battery for about 10 years.

Other features, as discussed above, can be selectively included. For example, sensor 190 can include a camera, a microphone, a global positioning system (GPS) module, a specialized sensor or detector. Likewise, the simplified traffic data collection node 200 can be tailored for a particular implementation of a network.

Figure 3:
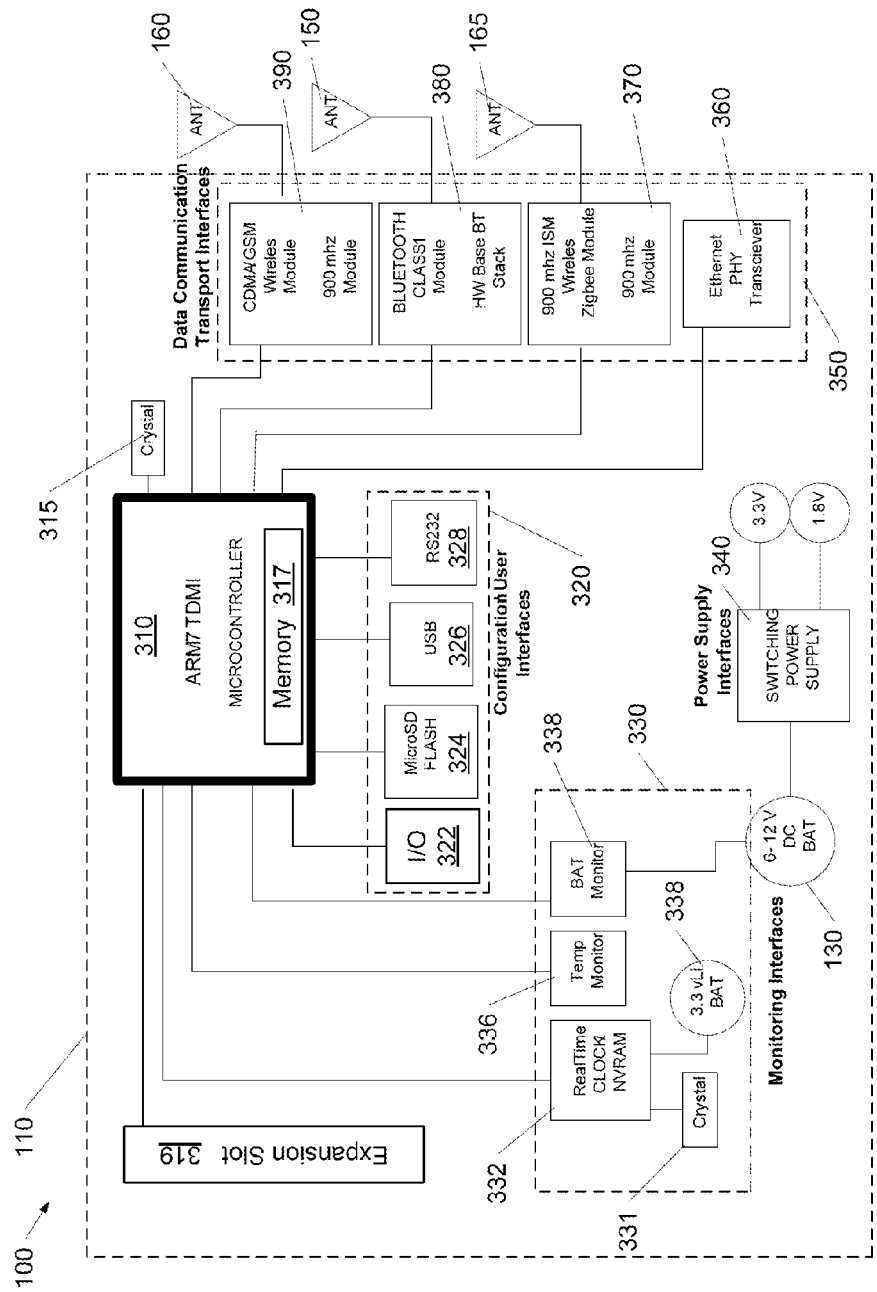
FIG. 3 is a functional diagram of the traffic data collection node of FIG. 1 in accordance with a representative embodiment.

Referring now to FIG. 3, a functional diagram of the traffic data collection node 100 of FIG. 1 in accordance with a representative embodiment is shown. A computing module 110 of the traffic data collection node 100 includes a microcontroller 310, configuration/user interfaces 320, monitoring interfaces 330, a power supply interface 340, and data communication and transport interfaces 350. As discussed above, the computing module 110 can have various levels of integration.

In this example, an energy storage device 130 is integrated onto the printed circuit board of the computing module 110. The energy storage device 130 is a 6 V DC or 12 V DC battery. The energy storage device 130 provides power to the power supply interface 340. The power supply interface 340 can be, for example, a switching power supply that converts the voltage of the energy storage device 130 to lower voltages for the components of the computing module 110. For example, the power supply interface 340 can produce a 1.8 V and 3.3 V source to supply the board.

The microcontroller 310 is a processor that controls the traffic data collection node 100. The microcontroller 310 includes a computer-readable medium such as memory 317 that contains computer-readable instructions for operating the traffic data collection node 100. Microcontroller 310 executes the instructions for operating the traffic data collection node 100. Alternatively, memory 317 can be distinct from microcontroller 310. The microcontroller 310 is clocked by crystal 315. The microcontroller 310 is also connected to an expansion slot 319. The expansion slot(s) 319 can be used to add additional capabilities to traffic data collection node 100; for example a camera or auxiliary processing module can be added as discussed above.

The microcontroller 310 can be, for example, an ARM7 microcontroller such as the ARM7TDMI available from various manufacturers including Taiwan Semiconductor Manufacturing Company in Hsinchu, Taiwan. The ARM7TDMI core is a 32-bit embedded RISC processor delivered as a hard macrocell that provides an acceptable combination of performance, power and area characteristics. The ARM7TDMI core enables system designers to build embedded devices requiring small size, low power and high performance.

The ARM7TDMI core contains 128 kB of internal flash memory for firmware storage and 34 kB of internal SRAM for runtime storage. The onboard memory reduces the need for any external discrete memory subsystems that traditional Bluetooth based systems require. The microcontroller 310 interfaces with three subsystems: configuration/user interfaces 320, monitoring interfaces 330, and data communication and transport interfaces 350.

The configuration/user interfaces 320 include an input/output interface 322, a flash card interface 324, a universal serial bus 326, and a serial port 328. The input/output interface 322 can be any kind of communications port. For example, the input/output interface 322 can be a digital output for triggering a camera, a graphics interface, a digital or analog input coupled to a sensor, or an interface to an auxiliary input/output module.

The flash card interface 324 includes a flash card such as a MicroSD-type flash card. The flash card interface 324 controls communications between the microcontroller 310 and a flash card. The flash card interface 324 can be used for storing data such as discovered Bluetooth MAC addresses or instructions for operating the traffic data collection node 100. For example, a MicroSD flash can be used to store a Bluetooth MAC address data and time stamp that can be retrieved later for further processing. A user can retrieve data from the traffic data collection node 100 by removing and reading the flash card. Similarly, a user can update computer-readable instructions for operating the traffic data collection node 100 by replacing or updating the flash card.

The universal serial bus 326 and the serial port 328 can also be used to communicate with the microcontroller 310. The serial port 328 can be, for instance, a RS-232 or RS-485 type port. The traffic data collection node 100 can be configured and serviced via universal serial bus 326 and/or the serial port 328. The universal serial bus 326 and the serial port 328 can also be used to attach peripheral devices and sensors such as cameras, temperature sensors, etc. as discussed above.

The monitoring interfaces 330 include a real-time clock 332, a temperature monitor 336, and an energy source monitor 338. The real-time clock 332 includes a crystal 331 and a backup battery 335. The crystal 331 is, for example, an independent local 32.768 khz crystal oscillator. The backup battery 335 is, for example, a 3.3 v lithium ion battery that provides power to the real-time clock 332 in the event that main power has been lost or the traffic data collection node 100 requires servicing. Data, time and date stamps produced by the microcontroller 310 are maintained via the real-time clock 332, which is clocked from the crystal 331 to reduce any potential clock integrity problems. Firmware also provides the ability to synchronize the time and date of the real-time clock 332 with a remote network time-date server. As a result, time and date accuracy is maintained to insure accurate speed calculation.

The temperature monitor 336 monitors the internal temperature of the traffic data collection node 100. The temperature monitor 336 includes a temperature sensor or sensors. Data from the temperature monitor 336 are passed to the microcontroller 310 using, for example, a serial peripheral interface bus. The temperature data can then be sent to a central processing center for analysis.

The energy source monitor 338 can be, for example, a battery monitor. The energy source monitor 338 monitors energy storage device 130, for instance, a battery. The energy source monitor 338 can be implemented as an 8-bit analog to digital converter built into the microcontroller 310. The battery health data can then be sent to a central processing center for analysis. Alternatively, where the energy storage device 130 is a fuel cell, the energy source monitor 338 can send a low fuel warning to the central processing center.

The data communication and transport interfaces 350 include a cellular modem 390, a Bluetooth module 380, a network module 370, and an Ethernet module 360. The cellular modem 390 transmits and receives data from the microcontroller 310 via a cellular antenna 160. The cellular modem 390 can be a CDMA/GSM wireless module. The cellular modem 390 enables communication between the traffic data collection node 100 and a central processing center. The traffic data collection node 100 can send and receive data packets to and from the central processing center using a cellular phone network; thus, the traffic data collection node 100 does not have to be hardwired in order to collect and report data. Alternatively, any computer can communicate with the traffic data collection node 100 via the packet-based cellular phone network. The cellular modem 390 can also be used to remotely update the computer-readable instructions for operating the traffic data collection node 100. For example, an over-the-air protocol can be used to reflash the software. The cellular antenna 160 can be internal, integrated or external. The cellular modem 390 connects to a GPRS/EDGE wide area network thus providing a robust data collection capability. Standardized cellular components can be used to create low-power and low-maintenance devices.

The Bluetooth module 380 primarily receives but can also transmit data from the microcontroller 310 via a Bluetooth antenna 150. The Bluetooth module 380 can be, for example, a Bluetooth Class 1 and/or Class 2 module, BlueCore4 IC. available from CSR, plc. of Cambridge, England. The Bluetooth module 380 contains a 2.4 GHz Bluetooth radio, a Bluetooth baseband digital signal processor (DSP), and a Bluetooth firmware based stack implemented in an 8-bit microcontroller. The microcontroller 310 interfaces to Bluetooth module 380 via a serial universal asynchronous receiver/transmitter (UART) interface. The Bluetooth module 380 has the ability to perform Bluetooth device inquiries. The microcontroller 310 can command the Bluetooth module 380 to perform a device inquiry. The Bluetooth module 380 returns the Bluetooth devices discovered in real-time to the microcontroller 310 to be recorded and logged to the flash card mounted at the flash card interface 324. For example, as a car with a discoverable Bluetooth transponder passes the traffic data collection node 100, the Bluetooth module 380 can discover the MAC address of the car's Bluetooth transponder and return the MAC address to the microcontroller 310. The microcontroller 310 time stamps the MAC address and saves the data to a flash card mounted at the flash card interface 324. Alternatively, other devices can be detected, for example, the module can be designed to probe for Wi-Fi devices, cell phones, satellite phones, or any other device that transmits a unique or pseudo-unique discovery signal or that responds to wireless inquiries.

The network module 370 transmits and receives data from the microcontroller 310 via a network antenna 165. The network module 370 allows the traffic data collection node 100 to form a network with other traffic data collection nodes and other simplified traffic data collection nodes. The network can be, for instance, a mesh network. Alternatively, other network configurations can be used. In one example, the network module 370 is a ZigBee (IEEE 802.15.4) transponder operating on the 900 MHz Industrial-Scientific-Medical (ISM) band. ZigBee mesh networking allows for linked data hops between receivers (traffic data collection nodes). ZigBee is a low-cost, low-power, wireless mesh networking standard.

The low cost allows the technology to be widely deployed in wireless control and monitoring applications, the low power-usage allows longer life with smaller batteries, and the mesh networking provides high reliability and larger range.

Alternatively, other networking schemes and protocols can be used. Hence, the traffic data collection node 100 can pass data to and from other the traffic data collection nodes. For example, in a case where only a few central nodes are equipped with active cellular modems or hardwired connections, other nodes can pass their data through the network to the central node for upload to a central processing center. Advantageously, the number of nodes requiring an expensive cellular modem is substantially reduced.

The Ethernet module 360 transmits and receives data from the microcontroller 310 via a hardline such as a Cat-5 cable. When connected to an Internet access point, the Ethernet module 360 enables communication between the traffic data collection node 100 and a central processing center. Alternatively, any computer can communicate with the traffic data collection node 100 when the Ethernet module 360 is connected to an Internet access point. The Ethernet module 360 can also be used to update (remotely or onsite) the computer-readable instructions for operating the traffic data collection node 100. Alternatively, the Ethernet module 360 can be replaced with a weatherproof coaxial-based hardline communications connection; for example, the traffic data collection node 100 can be connected to a cable television network or phone line.

Figure 4:
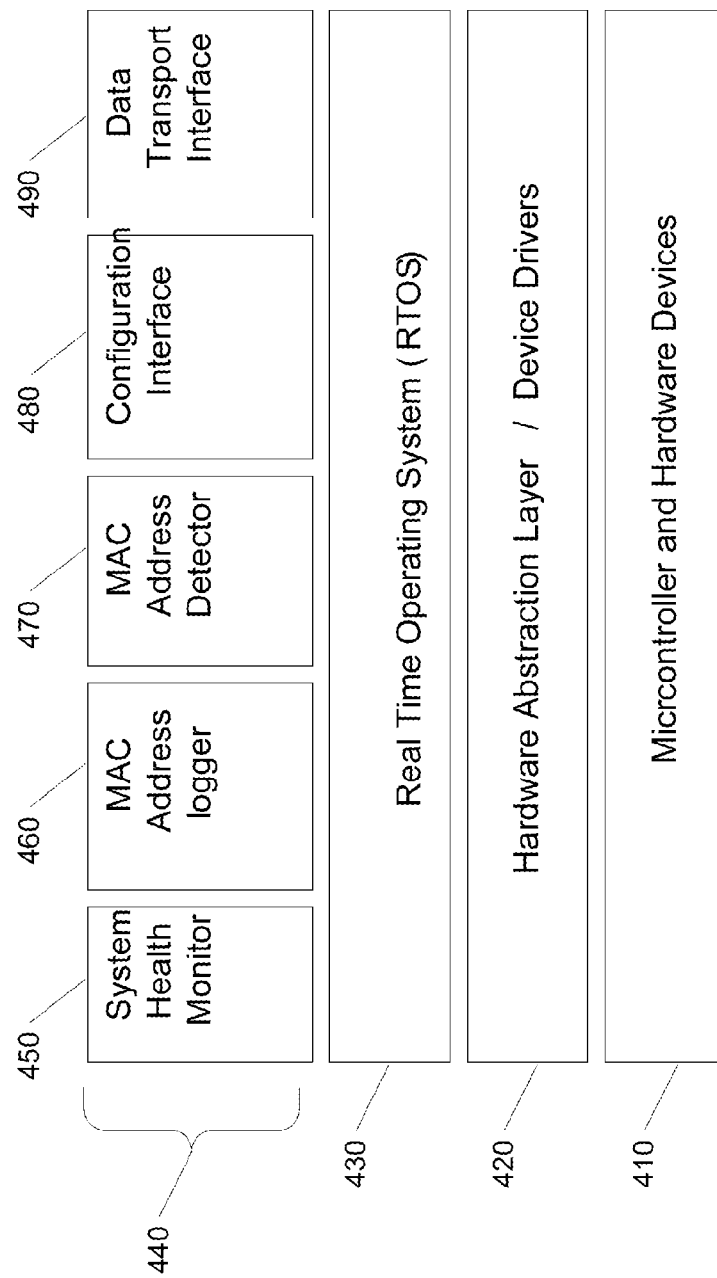
FIG. 4 is a diagram of an overview of a traffic data collection node architecture in accordance with a representative embodiment.

The basic functions of the traffic data collection node can be executed by firmware. Referring to FIG. 4, a diagram of an overview of a traffic data collection node architecture in accordance with a representative embodiment is shown. The architecture of the traffic data collection node includes a hardware layer 410, a hardware abstraction layer 420, a real-time operating system (RTOS) layer 430 and an application layer 440. The hardware layer 410 represents the physical implementation of the traffic data collection node as discussed above. The RTOS layer 430 consumes about ~50 kB of flash memory and 32 kB of runtime memory. A hardware abstraction layer 420 is between the hardware layer 410 and the RTOS layer 430 that allows the real-time operating system to communicate with the hardware using device drivers.

The application layer 440 includes the following application components: a system health monitor 450, a MAC address logger 460, a MAC address detector 470, a configuration interface 480, and a data transport interface 490. The system health monitor 450 monitors the health of the system and signals an alert when the health of the system in danger, for instance, when the battery is about to die or when the system is overheating. The MAC address detector 470 interacts with the driver (in the hardware abstraction layer 420) for the Bluetooth module and detects the MAC address of a device, such as a device in a car. The MAC address detector 470 notifies the MAC address logger 460 that it transferred a new MAC address element to the MAC address logger 460. The MAC address logger 460 records MAC addresses detected along with an associated time stamp. The configuration interface 70 handles the user configuration dialogs that occur over the driver (in the hardware abstraction layer 420) that handles the universal serial bus and the serial port. The data transport interface 490 is responsible for handling the cellular modem, the network module, and the Ethernet module.

Figure 5:
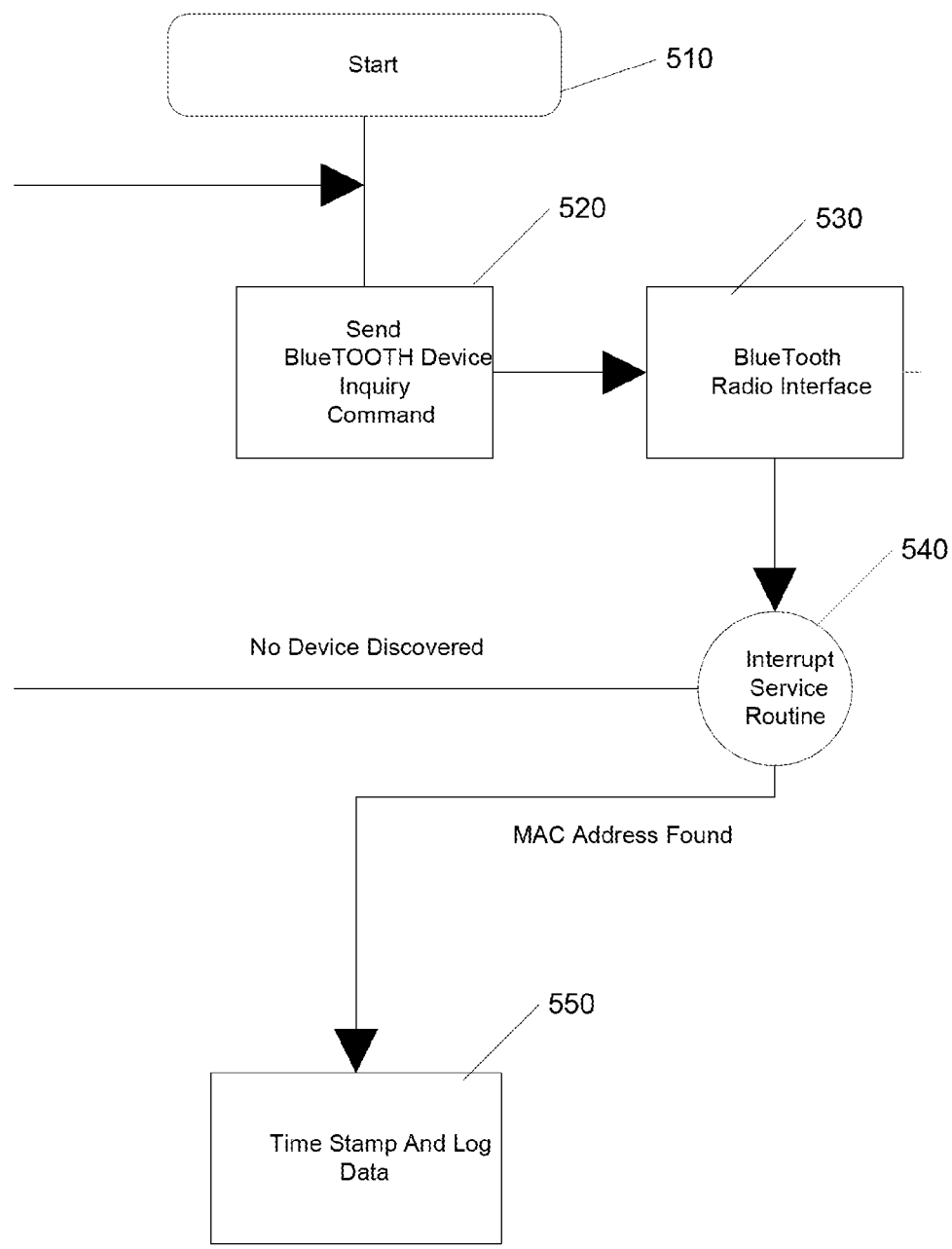
FIG. 5 is a flowchart of operations performed by a MAC address detector in accordance with a representative embodiment.

Referring to FIG. 5, a flowchart of the operations performed by a MAC address detector in accordance with a representative embodiment is shown. Additional, fewer or different operations may be performed. In a start operation 510, the MAC address detector initializes and begins the process of looking for Bluetooth devices. In a send Bluetooth device inquiry command operation 520, the MAC address detector sends an inquiry command to a Bluetooth module of a traffic data collection node via a Bluetooth module device driver which is part of the hardware abstraction layer. The MAC address detector 470 can look for Bluetooth devices periodically or look for Bluetooth devices as soon as resources are available. Alternatively, the MAC address detector 470 can change the rate it looks for Bluetooth devices based on time of date and prior results; thus, saving power. The inquiry command orders the Bluetooth module to detect any discoverable Bluetooth devices within the range of the Bluetooth module's 2.4 GHz radio transceiver, which for class 1 devices is about 100 meters and for class 2 devices is about 10 meters.

In a Bluetooth radio interface operation 530, the Bluetooth module attempts to find Bluetooth devices. The Bluetooth module, using its own hardware stack, operates independently of the microcontroller. When the Bluetooth module has a result, it interrupts the microcontroller.

In an interrupt service routine operation 540, the real-time operating system services the interrupt and forwards the result to the MAC address detector. The interrupt service routine operation 540 is preferably a high priority interrupt service routine. If the Bluetooth module did not find any Bluetooth devices, the MAC address detector returns to operation 520. However, if a Bluetooth device is found, in a time stamp and data log operation 550, the MAC address detector forwards the detected MAC addresses to the MAC address logger which then appends a time stamp to the detected MAC addresses and saves the data to a flash card.

Figure 6:
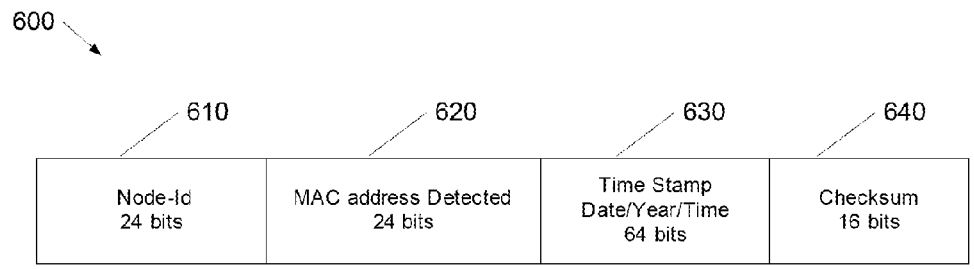
FIG. 6 is a diagram of a MAC address detection packet in accordance with a representative embodiment.

Referring to FIG. 6, a diagram of a MAC address detection packet 600 in accordance with a representative embodiment is shown. The MAC address logger assembles the MAC address detection packet 600 and saves the MAC address detection packet 600 to the flash card. The MAC address detection packet 600 includes a traffic data collection node id 610, a detected address 620, a time stamp 630, and a checksum 640. The MAC address detection packet 600 can be any length, for example, 16 bytes. The traffic data collection node id 610 is the 24 bit MAC address of the traffic data collection node that detected the Bluetooth device. The detected address 620 is the 24 bit MAC address detected by the MAC address detector. The time stamp 630 is the date, year, and time associated with the detection of the detected address 620. The checksum 640 is the checksum of the MAC address detection packet 600.

Optionally, the MAC address detection packet 600 can also include other fields such as data type, extension fields, destination address, and control flags. The MAC address detection packet 600 can be encrypted and include features such as forward error correction.

Studies show that about 3-5% of vehicles on U.S. roads have a Bluetooth device that is in discoverable mode. Thus, when monitoring a road, a traffic data collection node will probably detect one MAC address per minute on average. Hence, the traffic data collection node accumulates about 16 bytes of data per minute, or about 960 bytes per hour, or about 23 Kbytes per day. Data from a traffic data collection node can be sent to the central processing center about once every 5 minutes with about a 80 byte payload.

Traffic Management Network

In accordance with a representative embodiment, a traffic management network includes a plurality of traffic data collection nodes. The plurality of traffic data collection nodes of the traffic management network monitor and measure vehicular and pedestrian flows by measuring anonymous Bluetooth Media Access Control (MAC) addresses. The plurality of traffic data collection nodes collect MAC addresses from mobile devices such as headsets and in-dash sync services in cars. A MAC address is a unique identifier assigned to a network adapter by its manufacturer for identification. The data generated using the traffic management network can be used to calculate high quality, high density travel times by sampling a portion of actual travel times from a traffic stream.

In accordance with a representative embodiment, computers at a central processing station of the traffic management network match detected MAC addresses. The matched MAC addresses have respective time stamps. By matching MAC addresses from traffic data collection nodes at two different locations, computers at the central processing station can determine the speed and direction of the device associated with the MAC address.

In a representative embodiment, the traffic management network can be arranged in two configurations: a cellular packet-based network or a mesh-cellular packet-based network. Various combinations of the two approaches is possible. Alternatively, other networking configurations can be employed.

Figure 7:
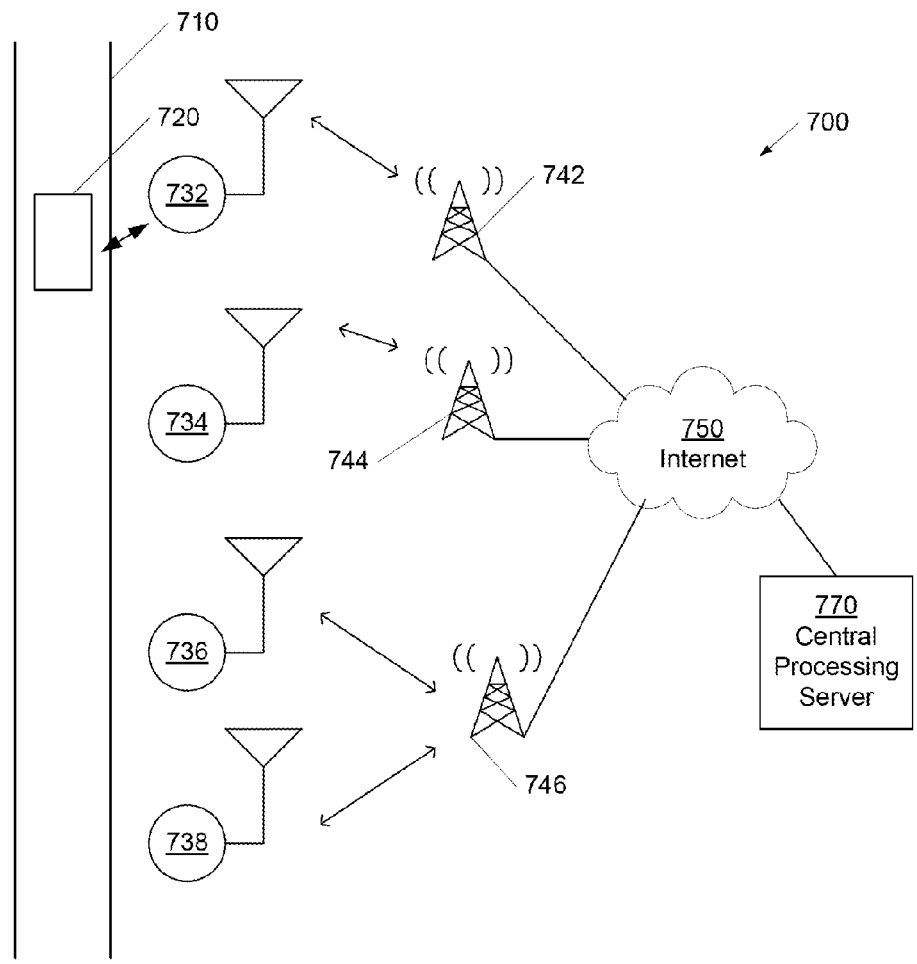
FIG. 7 is a diagram of a cellular packet-based network in accordance with a representative embodiment.

In a cellular packet-based network described with respect to FIG. 7, each traffic data collection node has a packet-based cellular modem (GSM or CDMA) which provides the individual traffic data collection nodes with Internet protocol (IP) based connectivity over a point-to-point-protocol (PPP) cellular link. In this configuration, a central processing center has the capability to communicate with each traffic data collection node "directly" over a standard TCP/IP based communication link.

Figure 8:
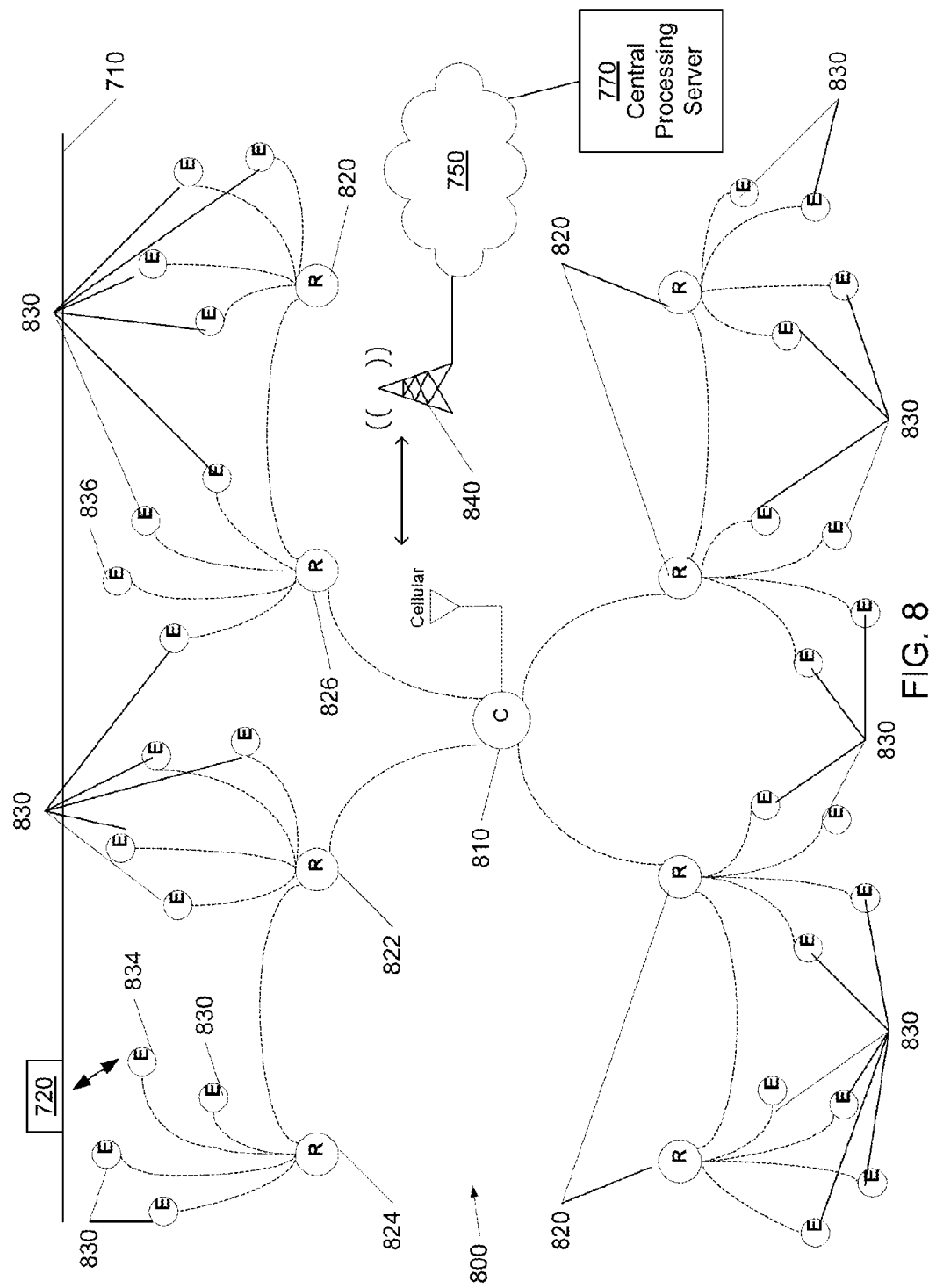
FIG. 8 is a diagram of a clustered tree type mesh-cellular packet-based network in accordance with a representative embodiment.
Figure 9:
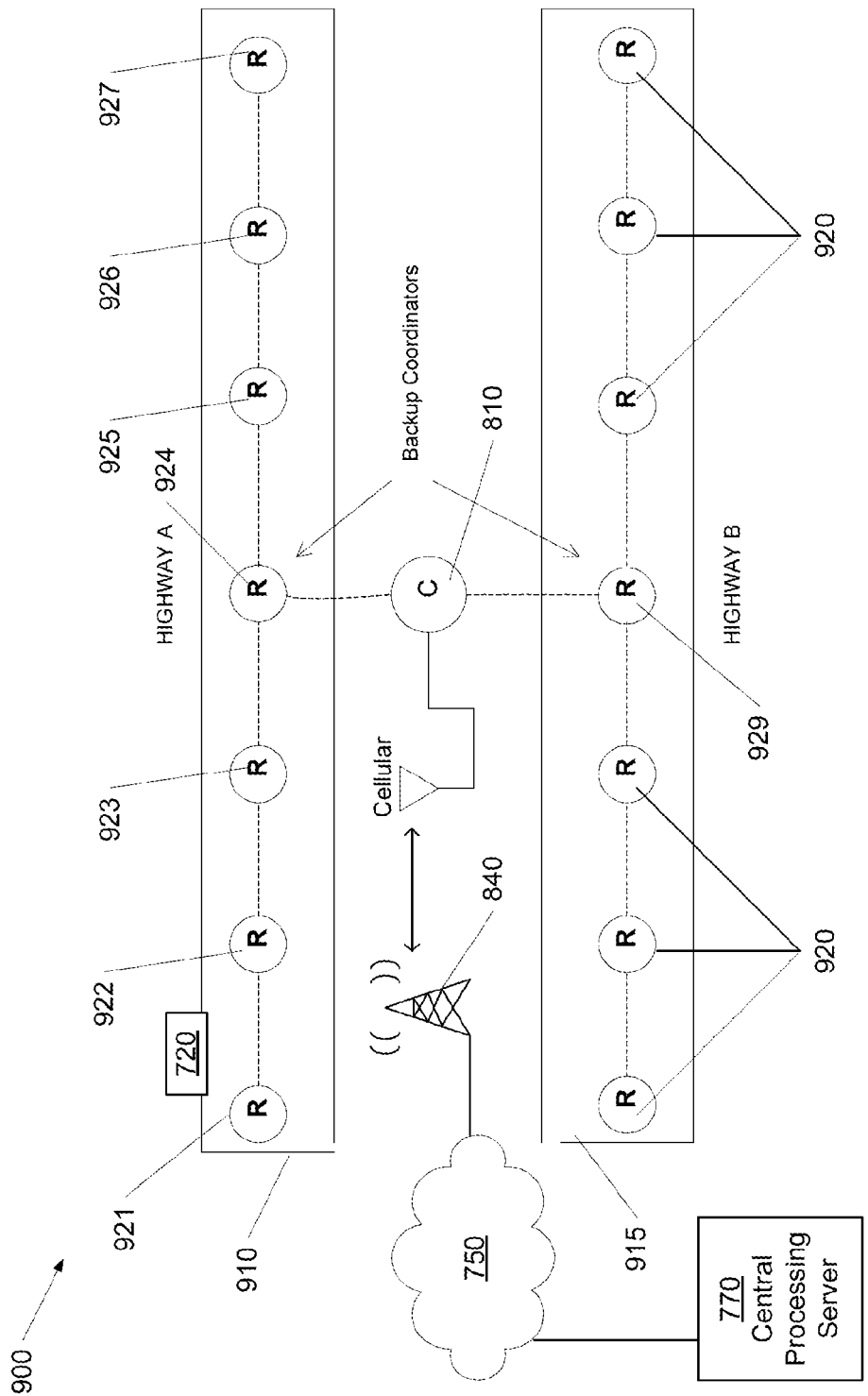
FIG. 9 is a diagram of a daisy-chain type mesh-cellular packet-based network in accordance with a representative embodiment.

In a mesh-cellular packet-based network described with respect to FIGS. 8 and 9, a traffic data collection node can be a coordinator, router, or end-point device. Coordinators collect data packets from other traffic data collection nodes in the traffic management network. The coordinators send the data packets to a central processing server via a cellular packet-based modem, which provides the coordinator node with IP-(internet protocol) based connectivity over a point-to-point-protocol (PPP) cellular link. Routers pass along data packets from other traffic data collection nodes in the traffic management network. End-points only send data packets to other traffic data collection nodes.

Referring to FIG. 7, a diagram of a cellular packet-based network 700 in accordance with a representative embodiment is shown. The cellular packet-based network 700 monitors, for example, traffic on a road 710. Traffic data collection nodes 732, 734, 736 and 738 are located near the road 710 so that when a vehicle 720 passes, the traffic data collection nodes 732, 734, 736 and 738 can detect a discoverable MAC address. Each of the traffic data collection nodes 732, 734, 736 and 738 is wirelessly connected to one of cellular base stations 742, 744 or 746. The cellular base stations 742, 744 and 746 are connected to Internet 750. A central processing station 770 is also connected to the Internet 750.

The traffic data collection nodes 732, 734, 736 and 738 pass collected data to the central processing station 770 using IP packets. Each of the traffic data collection nodes 732, 734, 736 and 738 is assigned a static IP address. Alternatively, the nodes can be assigned an IP address dynamically using Dynamic Host Configuration Protocol (DHCP). When the traffic data collection nodes 732, 734, 736 and 738 are initialized, they each form a point-to-point-protocol (PPP) cellular link to the central processing station 770. Since, each of the traffic data collection nodes 732, 734, 736 and 738 has its own link to the central processing station 770, the nodes can be placed as far apart as desired. The nodes can periodically or continuously upload data to the central processing station 770.

Each of the nodes communicates to the central processing station 770 independently, though the central processing station 770 can coordinate data collection and other activities amongst the nodes. For example, when the vehicle 720 passes traffic data collection node 732, traffic data collection node 732 detects the MAC address of vehicle 720. Traffic data collection node 732 time stamps and stores the data as a MAC address detection packet. Traffic data collection node 732 then sends an IP packet, addressed to the central processing station 770 and containing MAC address detection packet, to the base station 742. The IP packet may contain many MAC address detection packets. The base station 742 routes the IP packet to the Internet 750. The IP packet arrives at the central processing station 770. The central processing station 770 un-encapsulates the IP packet and processes the MAC address detection packet.

Likewise, when the vehicle 720 passes traffic data collection node 738, traffic data collection node 738 detects the MAC address of vehicle 720. Traffic data collection node 738 time stamps and stores the data as a MAC address detection packet. Traffic data collection node 738 then sends an IP packet, addressed to the central processing station 770 and containing MAC address detection packet, to the base station 746. The IP packet may contain many MAC address detection packets. The base station 746 routes the IP packet to the Internet 750. The IP packet arrives at the central processing station 770. The central processing station 770 un-encapsulates the IP packet and processes the MAC address detection packet. Thus, each of the traffic data collection nodes 732, 734, 736 and 738 has its own link to the central processing station 770.

The mesh-cellular packet-based network can take various forms, for instance, a clustered tree type configuration or a daisy-chain type configuration. Advantageously, the mesh-cellular packet-based network reduces the number of cellular modems needed for communicating with the central processing station thereby reducing hardware costs and usage fees. In a city-type environment, the traffic management network can be a clustered tree type configuration including coordinator nodes, router nodes, and endpoint nodes. In a highway-type environment, the traffic management network can be a daisy-chained type configuration including mostly coordinator nodes and router nodes.

Referring to FIG. 8, a diagram of a clustered tree type mesh-cellular packet-based network 800 in accordance with a representative embodiment is shown. The traffic data collection nodes of the clustered tree type mesh-cellular packet-based network 800 can be a coordinator node 810, a router node 820, 822, 824 and 826, or an end-point node 830, 834 and 836. All of the nodes can have the ability to detect Bluetooth addresses.

The coordinator node 810 is logically central to the network or sub-network and stores all information about the mesh network. The coordinator node 810 can have a communication link, for example, a ZigBee-based networking link, to router nodes or end-point nodes. The coordinator node 810 can be, for example, a traffic data collection node as described above. The coordinator node 810 can preprocess data and perform local analysis on data points. The coordinator node 810 and associated router nodes or end-point nodes can be spaced about 0.2 to 1 mile apart. In FIG. 8, the coordinator node 810 has direct wireless connections to four router nodes 822, 826 and 820.

The coordinator node 810 is wirelessly connected to a cellular base station 840. The cellular base station 840 is connected to Internet 750. A central processing station 770 is also connected to the Internet 750. The coordinator node 810 passes collected data to the central processing station 770 using IP packets. The coordinator node 810 is assigned a static IP address. Alternatively, a coordinator node can be assigned an IP address dynamically using DHCP. When the coordinator node 810 is initialized, it forms a point-to-point-protocol (PPP) cellular link to the central processing station 770.

The router nodes 820, 822, 824 and 826 serve as intermediate nodes and are responsible for passing data to and from coordinator nodes, other router nodes, and endpoint nodes over a communication link, for example, a ZigBee based networking link. The router nodes 820, 822, 824 and 826 can preprocess data and perform local analysis on data points. Some router nodes also contain the capability of utilizing a cellular packet-based modem to alert a central processing server 770 that a coordinator node has failed or is unreachable. The router nodes 820, 822, 824 and 826 can be, for example, a traffic data collection node as described above. The router nodes 820, 822, 824 and 826 and associated router nodes or end-point nodes can be spaced about 0.2 to 1 mile apart.

The end-point nodes 830, 834 and 836 can contain just enough functionality to communicate with a single coordinator node or a single router node over a communication link, for example, a ZigBee based networking link. The end-point nodes 830, 834 and 836 can be, for example, a simplified traffic data collection node as described above. The end-point nodes 830, 834 and 836 pass data to the router nodes 820, 822, 824 and 826 or the coordinator node 810. The end-point nodes 830, 834 and 836 can preprocess data and perform local analysis on data points. Because, nodes in a city-environment can be more clustered, cheaper end-point nodes can be used instead of more expensive router nodes. The end-point nodes 830, 834 and 836 provide the ability to place a low-cost, low-powered simplified traffic data collection node in an urban city-type environment to provide high traffic resolution in an area where roads may be tightly clustered together.

The clustered tree type mesh-cellular packet-based network 800 can be self-forming and self-healing. When the coordinator node 810, the router nodes 820, 822, 824 and 826, and end-point nodes 830, 834 and 836 are activated, they all attempt to self-form a mesh network by building links to each other. The end-point nodes 830, 834 and 836 attach to one of the router nodes 820, 822, 824 and 826, for instance, whichever router node provides the best network connection. The coordinator node 810 and the router nodes 820, 822, 824 and 826 attempt to build links to each other. The clustered tree type mesh-cellular packet-based network 800 attempts to reduce the number of active cellular modems in the system while still maintaining adequate data bandwidth. Hence, the clustered tree type mesh-cellular packet-based network 800 can have more than one coordinator node. The clustered tree type mesh-cellular packet-based network 800 can re-link in order to balance data loads. Additionally, if the links in the clustered tree type mesh-cellular packet-based network 800 fail or become weak, the clustered tree type mesh-cellular packet-based network 800 self-heals when the nodes form new links or paths between each other that avoid the failing node or weak link.

The clustered tree type mesh-cellular packet-based network 800 monitors, for example, traffic on a road 710. The coordinator node 810, the router nodes 820, 822, 824 and 826, and the end-point nodes 830, 834 and 836 are mostly located near the road 710 so that when a vehicle 720 passes, the coordinator node 810, the router nodes 820, 822, 824 and 826, and the end-point nodes 830, 834 and 836 can detect a discoverable MAC address.

When the vehicle 720 passes end-point node 834, the end-point node 834 detects the MAC address of vehicle 720. The end-point node 834 time stamps and stores the data as a first MAC address detection packet. The end-point node 834 sends the MAC address detection packet to router node 824; however, the end-point node 834 may only pass data to its associated router periodically. Router node 824 sends the first MAC address detection packet to router node 822. Router node 822 sends the first MAC address detection packet to coordinator node 810.

The coordinator node 810 then sends an IP packet, addressed to the central processing station 770 and containing the first MAC address detection packet, to the base station 840. The IP packet may contain many MAC address detection packets from various router nodes and end point nodes. The base station 840 routes the IP packet to the Internet 750. The IP packet arrives at the central processing station 770. The central processing station 770 un-encapsulates the IP packet and processes the first MAC address detection packet.

Later, when the vehicle 720 passes end-point node 836, the end-point node 836 detects the MAC address of vehicle 720. The end-point node 836 time stamps and stores the data as a second MAC address detection packet. The end-point node 836 sends the second MAC address detection packet to router node 826; however, the end-point node 836 may only pass data to its associated router periodically. Router node 826 sends the second MAC address detection packet to coordinator node 810.

The coordinator node 810 then sends an IP packet, addressed to the central processing station 770 and containing the second MAC address detection packet, to the base station 840. The IP packet may contain many MAC address detection packets from various router nodes and end point nodes. The base station 840 routes the IP packet to the Internet 750. The IP packet arrives at the central processing station 770. The central processing station 770 un-encapsulates the IP packet and processes the second MAC address detection packet.

The central processing station 770 can analyze the first MAC address detection packet and the second MAC address detection packet. For example, the central processing station 770 can use the data to monitor or analyze traffic conditions. In particular, the speed of the vehicle 720 can be calculated by knowing the positions of end-point node 834 and end-point node 836 and the time difference of the time stamps recorded the first MAC address detection packet and the second MAC address detection packet. The positions of end-point node 834 and end-point node 836 can be determined and recorded at installation, determined by global positioning system (GPS) modules included in the nodes, or determined using triangulation techniques in combination with the cellular network.

Referring to FIG. 9, a diagram of a daisy-chain type mesh-cellular packet-based network in accordance with a representative embodiment is shown. The traffic data collection nodes of the daisy-chain type mesh-cellular packet-based network 900 can be a coordinator node 810, a router node 920, 921, 922, 923, 924, 925, 926, 927 and 929, or an end-point node (not shown). All of the nodes can have the ability to detect Bluetooth addresses.

The coordinator node 810 is logically central to the network or sub-network and stores all information about the mesh network. The coordinator node 810 can have a communication link, for example, a ZigBee based networking link, to router nodes or end-point nodes. The coordinator node 810 can be, for example, a traffic data collection node as described above. The coordinator node 810 can preprocess data and perform local analysis on data points. The coordinator node 810 and associated router nodes or end-point nodes can be spaced about 0.2 to 1 mile apart. The coordinator node 810 can be linked to more than one daisy chain. For example, coordinator node 810 is linked to the daisy chain associated with Highway 'A' 910 and the daisy chain associated with Highway 'B' 915.

The coordinator node 810 is wirelessly connected to a cellular base station 840. The cellular base station 840 is connected to Internet 750. A central processing station 770 is also connected to the Internet 750. The coordinator node 810 passes collected data to the central processing station 770 using IP packets. The coordinator node 810 is assigned a static IP address. Alternatively, a coordinator node can be assigned an IP address dynamically using DHCP. When the coordinator node 810 is initialized, it forms a point-to-point-protocol (PPP) cellular link to the central processing station 770.

The router nodes 920, 921, 922, 923, 924, 925, 926, 927 and 929 serve as intermediate nodes and are responsible for passing data to and from coordinator nodes, other router nodes, and endpoint nodes over a communication link, for example, a ZigBee based networking link. The router nodes 920, 921, 922, 923, 924, 925, 926, 927 and 929 can preprocess data and perform local analysis on data points. Some router nodes also contain the capability of utilizing a cellular packet-based modem to alert a central processing server 770 that a coordinator node has failed or is unreachable. The router nodes 920, 921, 922, 923, 924, 925, 926, 927 and 929 can be, for example, a traffic data collection node as described above. The router nodes 920, 921, 922, 923, 924, 925, 926, 927 and 929 and associated router nodes or end-point nodes can be spaced about 0.2 to 1 mile apart.

Some of router nodes act as child router nodes, where the daisy chain links to the parent coordinator node. For example, router nodes 924 and 929 are child router nodes. Router nodes 924 and 929 are intermediate nodes for the rest of the nodes in the daisy-chained configuration. Router nodes 924 and 929 can also backup the coordinator node 810 is case of failure by becoming coordinator nodes.

The daisy-chain type mesh-cellular packet-based network 900 is self-forming and self-healing. When the coordinator node 810, and the router nodes 920, 921, 922, 923, 924, 925, 926, 927 and 929 (and any end-point nodes) are activated, they all attempt to self-form a mesh network by building links to each other. The coordinator node 810 and the router nodes 920, 921, 922, 923, 924, 925, 926, 927 and 929 attempt to build links to each other. The central processing station 770 can also direct the nodes to form a specific network configuration based on the node location, maps, predicted demand, etc. The daisy-chain type mesh-cellular packet-based network 900 attempts to reduce the number of active cellular modems in the system while still maintaining adequate data bandwidth. Hence, the daisy-chain type mesh-cellular packet-based network 900 can have more than one coordinator node. The daisy-chain type mesh-cellular packet-based network 900 can re-link in order to balance data loads. Additionally, if the links in the daisy-chain type mesh-cellular packet-based network 900 fail or become weak, the daisy-chain type mesh-cellular packet-based network 900 self-heals when the nodes form new links or paths between each other that avoid the failing node or weak link.

The daisy-chain type mesh-cellular packet-based network 900 monitors, for example, traffic on Highway 'A' 910. The coordinator node 810, the router nodes 921, 922, 923, 924, 925, 926 and 927 are mostly located near Highway 'A' 910 so that when a vehicle 720 passes, the coordinator node 810 and the router nodes 921, 922, 923, 924, 925, 926 and 927 can detect a discoverable MAC address.

When the vehicle 720 passes router node 921, the router node 921 detects the MAC address of vehicle 720. The router node 921 time stamps and stores the data as a first MAC address detection packet. The router node 921 sends the MAC address detection packet to router node 922; however, the router node 921 may only pass data to its associated router periodically. Router node 922 sends the first MAC address detection packet to router node 923. Router node 923 sends the first MAC address detection packet to router node 924, which is a child router node. Router node 924 sends the first MAC address detection packet to coordinator node 810.

The coordinator node 810 then sends an IP packet, addressed to the central processing station 770 and containing the first MAC address detection packet, to the base station 840. The IP packet may contain many MAC address detection packets from various router nodes and end point nodes. The base station 840 routes the IP packet to the Internet 750. The IP packet arrives at the central processing station 770. The central processing station 770 un-encapsulates the IP packet and processes the first MAC address detection packet.

Later, when the vehicle 720 passes router node 927, the router node 927 detects the MAC address of vehicle 720. The router node 927 time stamps and stores the data as a second MAC address detection packet. The router node 927 sends the second MAC address detection packet to router node 926; however, the router node 927 may only pass data to its associated router periodically. Router node 926 sends the second MAC address detection packet to router node 925. Router node 925 sends the second MAC address detection packet to router node 924, which is a child router node. Router node 924 sends the second MAC address detection packet to coordinator node 810.

The coordinator node 810 then sends an IP packet, addressed to the central processing station 770 and containing the second MAC address detection packet, to the base station 840. The IP packet may contain many MAC address detection packets from various router nodes and end point nodes. The base station 840 routes the IP packet to the Internet 750. The IP packet arrives at the central processing station 770. The central processing station 770 un-encapsulates the IP packet and processes the second MAC address detection packet.

The central processing station 770 can analyze the first MAC address detection packet and the second MAC address detection packet. For example, the central processing station 770 can use the data to monitor or analyze traffic conditions. In particular, the speed of the vehicle 720 can be calculated by knowing the positions of router node 921 and router node 927 and the time difference of the time stamps recorded the first MAC address detection packet and the second MAC address detection packet. The positions of router node 921 and router node 927 can be determined and recorded at installation, determined by global positioning system (GPS) modules included in the nodes, or determined using triangulation techniques in combination with the cellular network.

Advantageously, the traffic management network enables measurement of travel time and average vehicle speed with increased accuracy. Road speed is derived from travel times and accuracy is assured from the volume of Bluetooth MAC addresses collected. The origins and destinations (O-Ds) of Bluetooth devices associated with a moving object can be accurately measured at a reduced cost and with a larger sample size than possible using traditional methods. Advantageously, Bluetooth traffic monitoring is economical than closed-circuit video cameras, observers or axle counters on a cost per data point basis.

In the course of operation, the central processing station will receive multiple MAC detection packets at any given interval, relative to traffic flow. As outlined, these pairings can be used to yield speeds traveled by individual MAC addressees, which are then analyzed to determine current speed conditions on the road segment. Various road segments can be divided into separate lane collections. For example, two or more lanes can be divided into local lanes and express lanes or normal lanes and high occupancy vehicle (HOV) lanes. Using the relative signal strengths of the component MAC addresses, as measured by RSSI, the particular lane collection associated with a particular component MAC address can be determined. That is, RSSI measurements can be used to determine if a vehicle is in a local lane, an express lane, a normal lane or a HOV lane. Accurate RSSI based matching will also reduce errors caused by variations in the detection range of particular devices by the sensors.

In one representative embodiment, the central processing station can determine the type of lane of a vehicle. As an example, the following can be used to discern express lane versus local lane traffic. These algorithms can also be applied in a normal lane versus HOV lane configuration. In this representative embodiment, RSSI (receive signal strength indicator) data associated with detected MAC address data is used.

Figure 17:
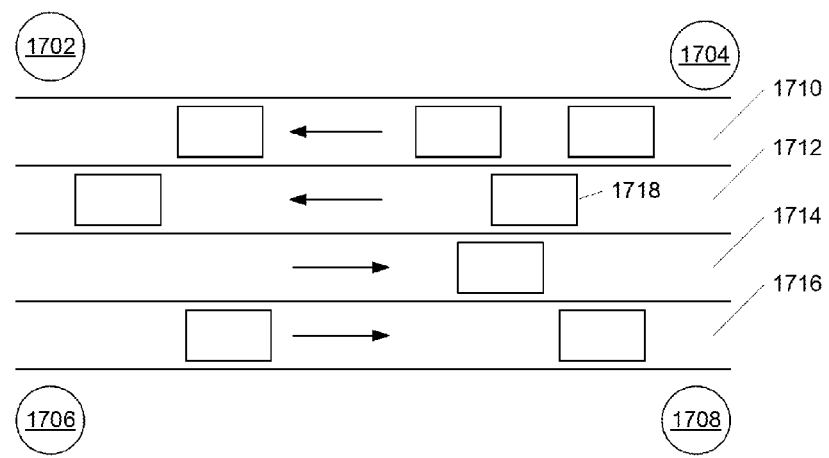
FIG. 17 is a diagram of a traffic management system in accordance with a representative embodiment.

FIG. 17 is a diagram of a traffic management system in accordance with a representative embodiment. The traffic management system includes four traffic data collection nodes 1702, 1704, 1706, and 1708. The data collection nodes 1702, 1704, 1706, and 1708 collect traffic data from one or more vehicles that are traveling in one of the lane collections 1710, 1712, 1714, and 1716. Each lane collection 1710, 1712, 1714, and 1716 can include one or more lanes of a particular type, e.g., local, express, normal, HOV. Vehicles in lane collections 1714 and 1716 are illustrated as traveling to the east and vehicles in lane collections 1710 and 1712 are illustrated as traveling to the west. In addition, the lane collections 1710, 1712, 1714, and 1716 can be associated with various types of traffic. For example, lane collection 1710 can be a local westbound lane; lane collection 1712 can be an express westbound lane; lane collection 1714 can be an express eastbound lane; and lane collection 1716 can be a local eastbound lane. When the data collection nodes 1702, 1704, 1706, and 1708 collect traffic data from one or more vehicles, the RSSI of the signals received the from the vehicles can be recorded. As described above, this information can be sent to a central processing station (not shown in FIG. 17).

In one representative embodiment, a relative RSSI ratio for a node couple, which is defined as a pair of two data collection nodes deployed opposite each other on each side of the road, e.g., nodes 1704 and 1708 or nodes 1702 and 1706, can be used to determine the type of lane collection in which a vehicle is traveling. As a particular vehicle (broadcasting one or more MAC addresses from Bluetooth devices inside the vehicle) passes through a node couple, the MAC addresses and associated RSSIs can be received and time-stamped at the two data collection nodes belonging to the given node couple. The strongest RSSI measurements for the given MAC addresses detected by the both data collection nodes can be used to create an RSSI ratio for this node couple. The detection methodology described in previous sections ensures that the given MAC addresses can be detected by both data collection nodes for a given node couple nearly simultaneously (e.g. within one second), so that the calculated RSSI ratio for the node couple can give accurate information about the relative distance between a particular vehicle and the two data collection nodes belonging to the node couple. The RSSI ratios over a time period and collected from various node couples can be used to differentiate the corresponding vehicles between different types of lane collections. For example, the RSSI ratios associated the vehicle 1718 for the node couple consisting of two data collection nodes 1702 and 1706 can be used to determine that vehicle 1718 is in the express lane collection 1712 and not the local lane collection 1710. The differentiation can be achieved by comparing the RSSI ratio associated the vehicle 1718 with baseline RSSI ratios corresponding to the different lane collections. Alternatively, the calculated RSSI ratios combined with the calculated speeds can also be used to separate vehicles into two groups associated with different lane collections by employing clustering algorithms in the two-dimensional space of speed and RSSI ratio.

In another representative embodiment, speed-based RSSI differentiation can be used to determine a lane collection associated with a group of vehicles. A pair of data collection nodes can have two speed profiles associated with traffic patterns of the differentiated lane collections. For example, data collection nodes 1702 and 1704 can have one speed profile associated with the local lane collection 1710 and another speed profile associated with the express lane collection 1712. The two speed profiles can be created when speed patterns between lane collections diverge. For example, when the speed of vehicles in the local lane collection 1710 begin to diverge from the express lane collection 1712, the two different speed profiles can be generated by employing clustering algorithms based upon the speed measurements.

Once the speed patterns have been separated, a certain number of data points for each of the speed patterns are used to calculate an absolute RSSI mean and a normalized RSSI mean for one or more data collection nodes (e.g. 1702, 1704, 1706, and 1708). The normalization of RSSI is achieved by dividing RSSI measurements by a heuristic RSSI value for a given type of Bluetooth device. The difference of the absolute RSSI mean and/or the difference of the normalized RSSI mean between two speed profiles can be used to associate these profiles with the different lane collections. Speed patterns will be associated with an absolute and/or normalized RSSI means. These values can be relatively larger or smaller according to the relative distance of the MAC detection from the sensor node. For example, mean values associated with the stronger RSSI for data collection node 1702 and 1704 will be associated with the closer local lane 1710, while the speed pattern associated with mean values of relative weaker RSSI from data collection nodes 1702 and 1704 will be associated with the express lane collection 1712, which is relatively farther away. This approach does not use the RSSI ratio, which is based on node couple configuration, so it is also suitable for a system configuration with two data collection nodes that do not have to be a node couple Alternatively, the traffic management network can enable the mapping of information on routing decisions. Tracking Bluetooth MAC addresses can identify trends in how and when drivers select their route options. Computers at the central processing station can use information provided by the traffic management network to track travel times, originations and destinations for a variety of modes of transportation (vehicles, rail, and pedestrian) on freeways, arterials and sidewalks (since the Bluetooth devices are associated with people rather than vehicles).

Traffic Management System

Figure 10:
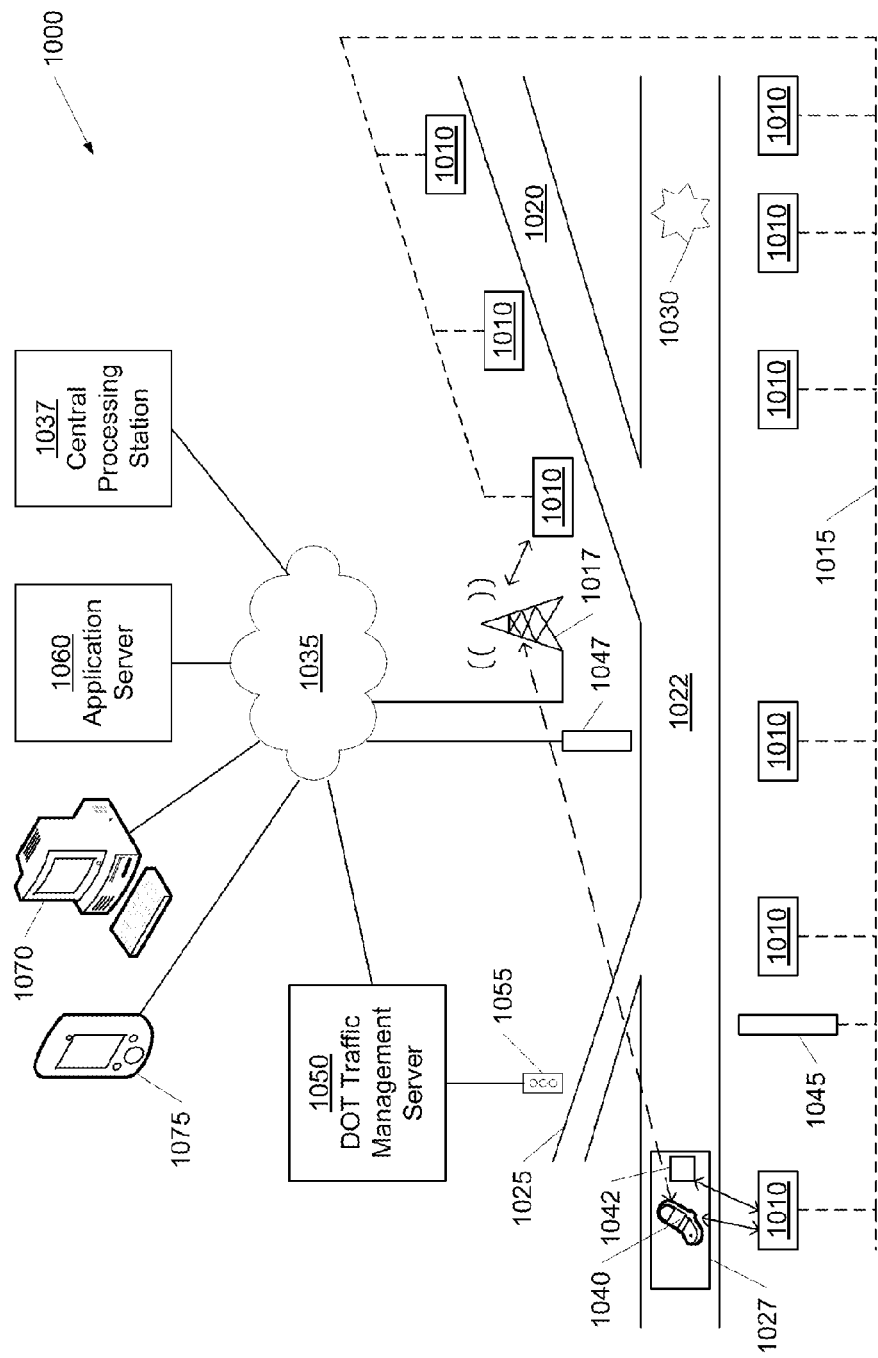
FIG. 10 is a diagram of a traffic management system in accordance with a representative embodiment.

Referring to FIG. 10, a diagram of a traffic management system 1000 in accordance with a representative embodiment is shown. The traffic management system 1000 can include a network 1015, nodes 1010, a cellular base station 1017, Internet 1035, a central processing station 1037, and an application server 1060. The nodes 1010 can be located along or near a road 1022. Road 1022 can include, for example, on-ramp 1025 and off-ramp 1020. Road 1022 can also include a first signage 1045, a second signage 1047, and a traffic light 1055. The first signage 1045 and the second signage 1047 can be a traffic sign, a message board, a traffic signal, or an electronic billboard.

The nodes 1010 anonymously discover, for example, Bluetooth MAC addresses, as described above. When a vehicle 1027 passes one of the nodes 1010, the particular node attempts to collect MAC addresses of wireless devices in the vehicle 1027. For example, the nodes 1010 can collect the MAC addresses of cell phone 1040 and navigation device 1042 which are in vehicle 1027. The navigation device 1042 can be a global positioning satellite (GPS) unit that matches the unit's location to a map. The nodes 1010 can be connected to the network 1015, as described above. For example, the network 1015 can be a daisy-chain type mesh-cellular packet-based network, a clustered tree type mesh-cellular packet-based network, an Ethernet network, or any other network. One or many of the nodes 1010 can be communicatively coupled to cellular base station 1017. Alternatively, each node 1010 can be communicatively coupled to cellular base station 1017. In addition, other devices such as first signage 1045 can also be connected to network 1015.

As the cell phone 1040 and navigation device 1042 pass nodes 1010, the MAC addresses of the cell phone 1040 and navigation device 1042 can collected by nodes 1010, be time stamped, and sent to central processing station 1037 through network 1015, cellular base station 1017 and Internet 1035, as discussed above. In one illustrative embodiment, the central processing station 1037 can use the MAC addresses, node locations, and time stamps to determine travel time, vehicle speed, and vehicle direction (directionality), as discussed above. Thus, as many vehicles pass nodes 1010, various conditions of the road can be determined such as traffic congestion and traffic speed. For example, if a crash 1030 occurs on the road 1022, the central processing station 1037 can determine that vehicles are not moving if the nodes 1010 do not detect progression of the cell phone 1040 and navigation device 1042 or that vehicles are moving too slowly if the time the cell phone 1040 and navigation device 1042 take to pass successive nodes implies traffic has slowed.

Information about vehicle travel time, vehicle speed, and vehicle direction can be shared with an application server 1060 over Internet 1035. In one illustrative embodiment, the application server 1060 can be operated by a third party. The application server 1060 can be used to aggregate traffic data, analyze traffic data, and provide enhanced services based on the traffic data.

For example, the central processing station 1037 can pass vehicle travel time, vehicle speed, and vehicle direction associated with the crash 1030 to application server 1060. Additional information can also be included such as an indication that the crash 1030 has occurred. The application server 1060 can provide information to drivers regarding the crash 1030. For example, the application server 1060 can send a message to first signage 1045, via network 1015, instructing the first signage 1045 to display a message such as "Accident Ahead. Please slow down."

Alternatively, application server 1060 can reroute traffic. The application server 1060 can send a message to second signage 1047, via Internet 1035, instructing the second signage 1047 to display a message such as "Accident Ahead. Temporary Detour. Please Exit" which causes drivers to take off-ramp 1020, thereby decongesting the road 1022. The application server 1060 can also cause other signage to display driving instructions to complete a detour route.

Alternatively, the application server 1060 can send an email or text message describing the traffic conditions to cell phone 1040. Alternatively, the nodes 1010 can also send information, such as the accident warning, back to the cell phone 1040 and navigation device 1042 via network 1015 (e.g. over the Bluetooth link). For instance, users could register for a service that allows the nodes 1010 to pair with their Bluetooth devices.

Alternatively, application server 1060 can stop traffic from entering the road 1022. For example, application server 1060 can send a message to a Department of Transportation (DOT) traffic management server 1050, via Internet 1035, informing the DOT that an accident has occurred at the location of crash 1030. The DOT traffic management server 1050 can control traffic light 1055 to prevent more vehicles from entering the on-ramp 1025, thereby decongesting the road 1022. In addition, the application server 1060 and the DOT traffic management server 1050 can use the vehicle travel time, vehicle speed, and vehicle direction to deploy resources such as police, road crews, ambulances, plows, etc.

Figure 11:
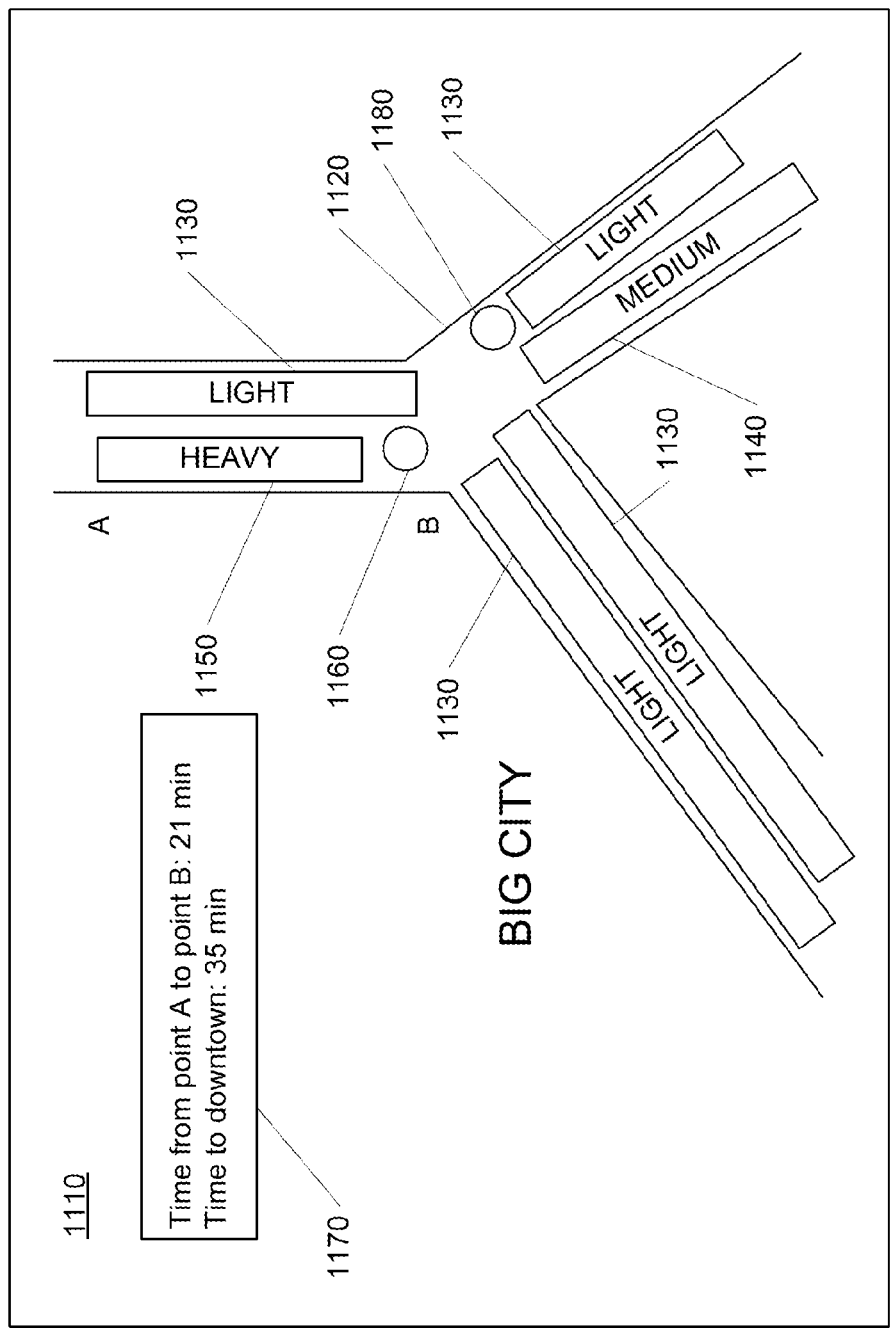
FIG. 11 is an illustration of a traffic map in accordance with a representative embodiment.

In another illustrative embodiment, information regarding traffic conditions can be compiled for various end users. For example, application server 1060 can determine current or historical travel times for roads. Referring to FIG. 11, an illustration of a traffic map 1110 in accordance with a representative embodiment is shown. The traffic map 1110 can show a road system 1120 for a city (depicted as "Big City"). The application server can use vehicle travel time, vehicle speed, and vehicle direction in combination with maps and posted speed limits to generate traffic map 1110. Traffic map 1110 can show the congestion of road system 1120. For example, traffic map 1110 can show areas of light congestion 1130, medium congestion 1140, and high congestion 1150. Traffic map 1110 can show accident 1160. Information regarding the accident 1160, such as location, severity, and driver instructions, can be determined by the application server 1060 or provided by another source such as the DOT. In addition, travel times 1170 can be calculated and displayed.

In another illustrative embodiment, information regarding relative road speeds and/or travel times of lane choices can be provided to drivers. For example, drivers may be offered the choice to travel on a collection of "local lanes" (with all entrances/exits available) versus "express lanes" (with limited exits). The key determinant of choice is typically travel time to a common travel point shared by the lane choices. The combination of road speeds determined by time-stamped MAC detections with relative signal strengths of those detections will enable the distinction to be communicated to drivers. Similarly, where road segments include both free and tolled lanes, the relative travel times can be communicated to enable drivers to determine whether the additional fee may compensate for a potentially reduced travel time. The methodology can also apply to measurement and detection of vehicle queuing, such as occurs during stop times at traffic signals.

Optionally, the traffic map 1110 can also display the location of certain vehicles. For example, the MAC address of a wireless device associated with a known vehicle 1180 can be stored by the application server 1060. As discussed above, MAC addresses are anonymous. However, if a user chooses to register the MAC address of his device with a database, the device (and the associated person or vehicle) can then be tracked. When the known vehicle 1180 passes a node 1010, the MAC address associated with the known vehicle 1180, node identifier, and a time stamp can be sent to the central processing station 1037 for processing and then to application server 1060. The application server 1060 can match the MAC address with an identifier of the known vehicle 1180. For example, MAC address "01:23:45:67:89:ab" could be associated with "city snow plow 19." Thus, when MAC address "01:23:45:67:89:ab" is detected at a node, the map can display the location of "city snow plow 19." Advantageously, a city can track its snow plows and manage resources, for instance, a manager can easily determine what roads have been plowed and need to be plowed.

Likewise, any other vehicle can be matched with a particular MAC address. For example, police cars, ambulances, road crews, fleets of trucks, and/or employees can be associated with a MAC address and later tracked. In another illustrative embodiment, parents could track the location of their children by registering the MAC address of a child's cell phone in a database. When a teenager is out driving, the MAC address of the child's cell phone will be detected by nodes. The application server 1060 can match the stored MAC address of the child's cell phone with incoming node data. When the application server 1060 detects a match, the application server 1060 can report the location of the child based on the detection at the node. Similarly, a parent can also monitor a child's driving speeds and travel habits.

Referring again to FIG. 10, traffic information, such as the traffic map, can be displayed and/or analyzed on a computer 1070, a smart phone 1075, the cell phone 1040, or the navigation device 1042. The traffic information can be combined with other sources of information such as weather, news, resource deployment, and personal data (e.g. travel plans). For example, the navigation device 1042 can use the traffic information provided by application server 1060 to reroute travel plans entered by the user. In another example, a user can check a website including the traffic map of FIG. 11 before leaving for work using the computer 1070 or smart phone 1075. Advantageously, users of the traffic management system can quickly receive and/or obtain current traffic information in order to adapt to changing road conditions.

Alternatively, a traffic management system can also monitor pedestrian traffic. For example, a traffic management system can be used to monitor congestion in a terminal such as an airport. In addition, a traffic management system can be used to serve individualized advertisements using available signage. For example, a vehicle, or groups of vehicles, associated with a MAC address(es) that has not "stopped" for many hours may be targeted with a food advertisement sent to a nearby electronic billboard. Alternatively, when the user of a registered MAC address passes a node near an electronic billboard, an application server can send an individualized advertisement to the billboard for display. Similarly, an individualized advertisement can be sent to a cell phone, navigation device, etc. based on the location of a node that detects the registered MAC address. Thus, advertisers such as truck stops can send advertisements targeted to a profile of a user with a registered MAC address as the user passes near a specific location. For instance, the advertisement could be sent as the vehicle approaches the truck stop.

Undiscoverable Bluetooth Devices

As described above, a MAC address associated with a Bluetooth device can be determined if the device is in a Discovery Mode. In another representative embodiment, a quasi-unique identifier can be determined for Bluetooth devices that are in a non-discoverable mode. Identifiers can be read from data packets that are transmitted from the devices. Accordingly, a traffic data collection node does not have to transmit or broadcast any requests to the Bluetooth devices to collect identifiers from devices in a non-discoverable mode. Rather, the traffic data collection node can receive data packets intended for other device and use header information within the data packets to derive an identifier. In one embodiment, the traffic data collection node does not include a Bluetooth stack or protocol that are used to transmit Bluetooth data.

In some embodiments, the identifier can be based upon the MAC address of a non-discoverable device. In one representative embodiment, the identifier is a portion of the device's MAC address. For example, the identifier can be network interface controller component of the MAC address, which is considered quasi-unique, without the organizational unique identifier. This quasi-unique identifier can be used in place of a MAC address from a discoverable device. Accordingly, the quasi-unique identifier can be used in place of the MAC address in the various embodiments discussed above.

Versions of Bluetooth use 79 different channels that are used to send data between Bluetooth devices. In one representative embodiment, a traffic collection node can scan all 79 channels for Bluetooth data. Any data that is found can be used to determine a quasi-unique identifier. Thirty-two of the 79 channels are dedicated pairing channels. Accordingly, scanning for quasi-unique identifiers allows all of the Bluetooth channels to be scanned for devices, rather than just the 32 dedicated channels. In other representative embodiments, a traffic data collection node can scan less than all available Bluetooth channels.

Figure 12:
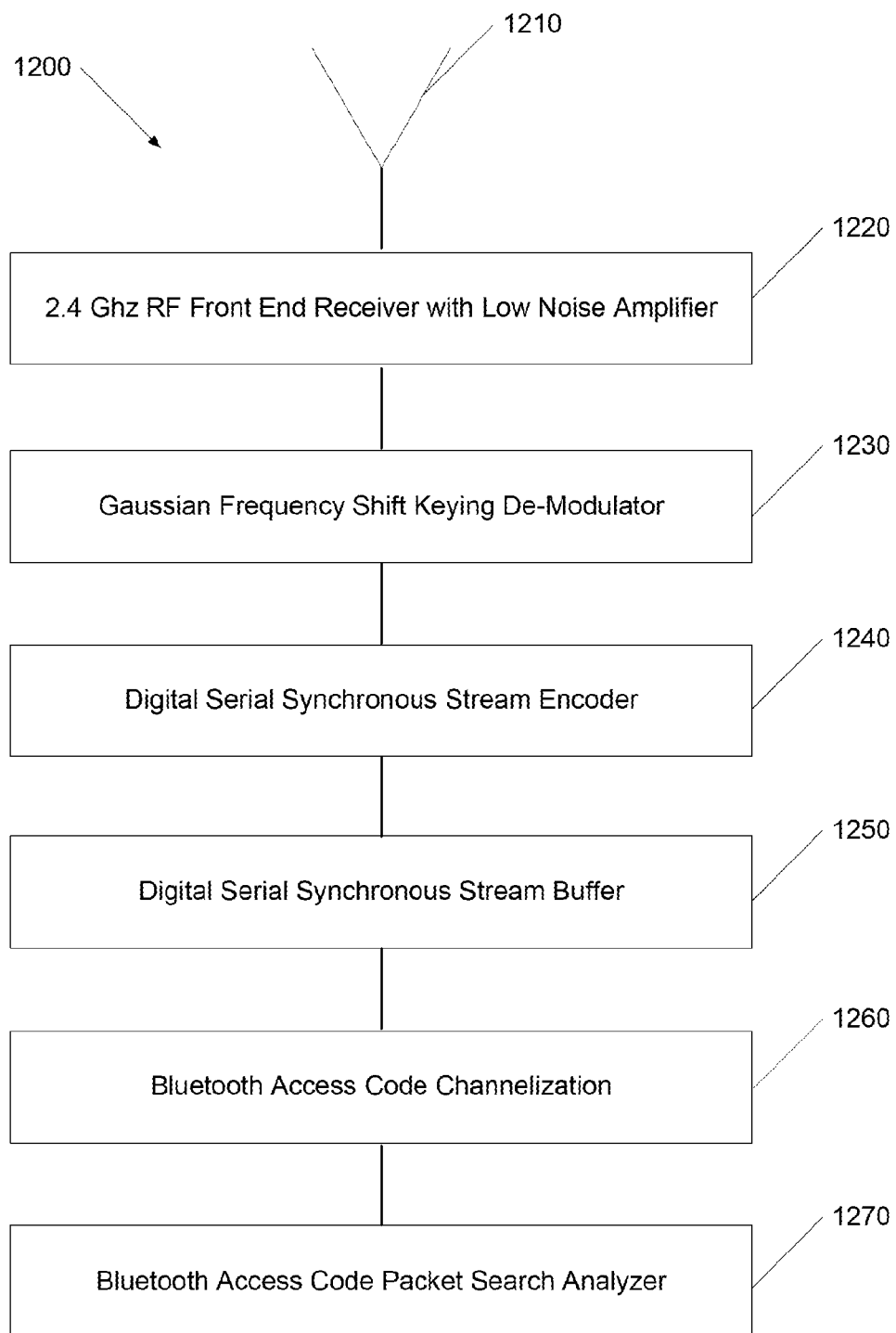
FIG. 12 is a diagram of an address analyzer in accordance with a representative embodiment.

FIG. 12 is a diagram of an address analyzer in accordance with a representative embodiment. In one representative embodiment, the address analyzer 1200 can be integrated into a traffic data collection node. In other representative embodiments, the address analyzer 1200 can replace the Bluetooth MAC address detection of discoverable devices components in the traffic data collection node. The address analyzer 1200 can include an antenna 1210 and a front end receiver 1220. For example, for current versions of Bluetooth, the front end receiver 1220 can be a 2.4 Ghz RF front end that includes a low noise amplifier. The front end receiver 1220 can be tuned to any of the 79 Bluetooth channels, allowing data to be accessed from any one of the 79 channels. In one representative embodiment, a sequential frequency scanner is used to scan the channels. In this embodiment, all 79 channels can be scanned in a linear fashion. In another implementation, the channels can be scanned using an adaptive scheduled based upon a frequency hopping algorithm. A Gaussian frequency shift keying (GFSK) de-modulator 1230 is used to demodulate Bluetooth transmitted data. In various Bluetooth versions, data is transmitted using GFSK modulation. The address analyzer 1200 can also include a digital serial synchronous stream encoder 1240. For example, the encoder 1240 can encode data in a non-return-to-zero mode or a Manchester code mode. The encoded data can be stored in a digital serial synchronous stream buffer 1250. The buffer can contain data from one of the Bluetooth channels. A Bluetooth access code channelization 1260 component can isolate data associated with a Bluetooth channel. A Bluetooth access code packet search analyzer 1270 can search each of the channels from the Bluetooth access code channelization 1260 to determine if there are any valid Bluetooth data packets. An identifier can be derived from any valid Bluetooth data packets that are found.

Figure 13:
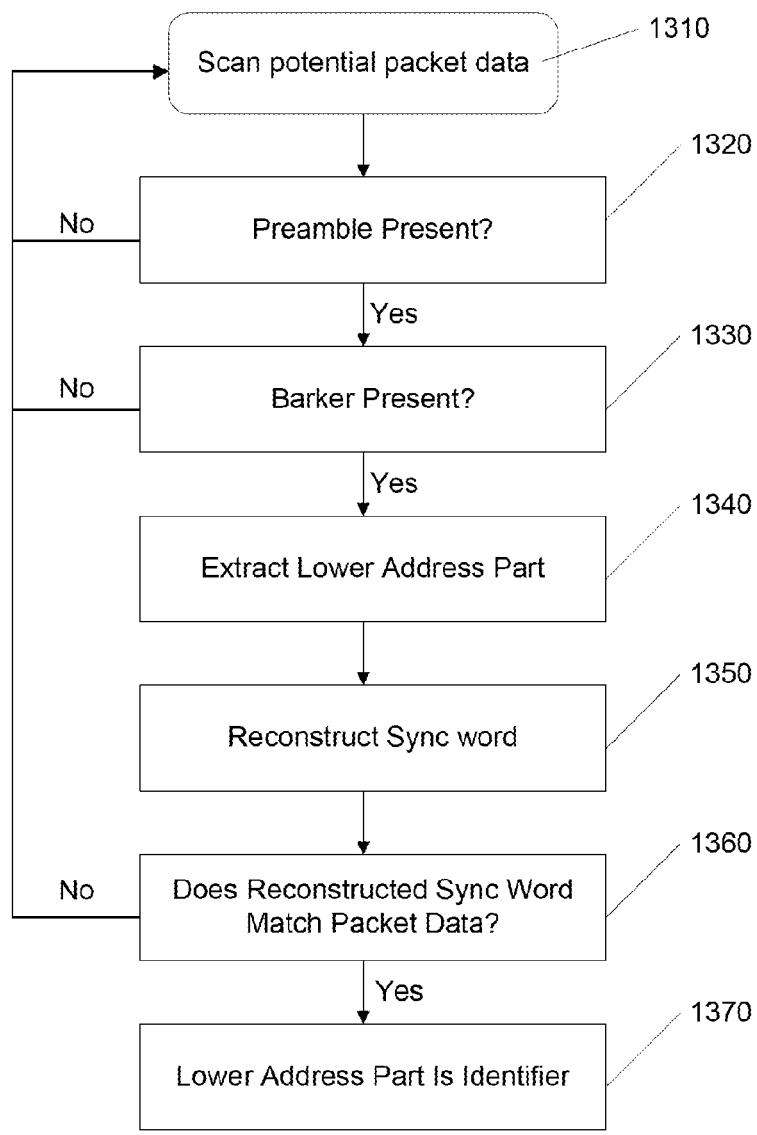
FIG. 13 is a flowchart of operations performed by a Bluetooth access code packet search analyzer in accordance with a representative embodiment.
Figure 14:
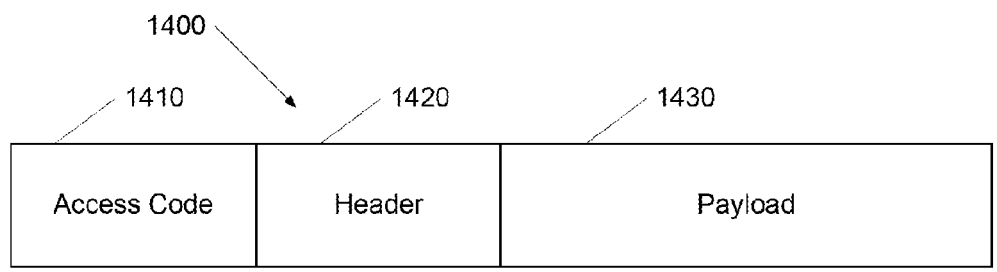
FIG. 14 is a diagram of a Bluetooth packet format.
Figure 15:
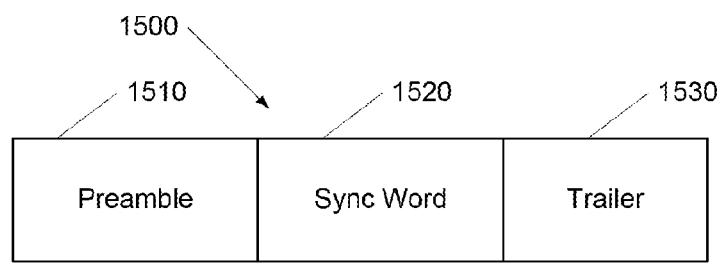
FIG. 15 is a diagram of an access code format.

FIG. 13 is a flowchart of operations performed by a Bluetooth access code packet search analyzer in accordance with a representative embodiment. The access code packet search analyzer 1270 scans potential packet data (1310). For example, data can be scanned from the digital serial synchronous stream buffer 1250 or provided by the access code channelization component 1260. In one representative embodiment, a block of bits is scanned, and whose length corresponds with the length of an access code in a Bluetooth packet. For example, in one representative embodiment, a 72-bit block is scanned, which corresponds with an access code in a Bluetooth packet. FIG. 14 is a diagram of a Bluetooth packet format 1400. A Bluetooth packet includes an access code 1410, a header 1420, and a payload 1430. The access code 1410 can be 68 bits or 72 bits long. The access code 1410 format is provided by the Bluetooth specification. FIG. 15 is a diagram of an access code format 1500. The access code format 1500 includes a preamble 1510, a sync word 1520, and a trailer 1530. The preamble 1510 is either 1010 or 0101 based upon the least significant bit of the sync word. The trailer 1530 is optional and if present will be either 1010 or 0101 depending on the most significant bit of the sync word.

Figure 16:
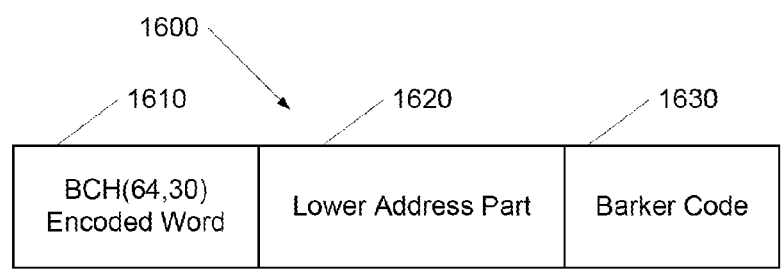
FIG. 16 is a diagram of a sync word format.

The access code packet search analyzer 1270, determines if the potential packet data starts with a preamble (1320). For example, the access code packet search analyzer 1270 can look for either known preamble pattern. If a preamble is not found, the access code packet search analyzer 1270 can scan the next bit block in the current channel or from another channel. If a preamble is found, the data block is scanned for a barker code located in the sync word (1530). FIG. 16 is a diagram of a sync word format 1600. The sync word format 1600 includes a BCH encoded word 1610, a lower address part 1620, and a barker code 1630. The barker code 1630 can be a known six bit sequence of 001101 or 110010 based upon the most significant bit of the lower address part 1620. The position of the barker code can be calculated based upon the position of the preamble. For example, in one representative embodiment, the barker code is 72 bits from the start of the preamble, which accounts for the length of the preamble 1510, the BCH encoded word 1610, and the lower address part 1620. If a barker is not found, the access code packet search analyzer 1270 can scan the next bit block in the current channel or from another channel. If the barker is found, the lower address part can be extracted from the sync word (1340).

To further verify that the current potential packet data includes a valid Bluetooth packet, the sync word can be reconstructed using the lower address part 1620 and the barker code 1630 (1350). In one representative embodiment, the sync word is reconstructed as defined in the Bluetooth specification. For example, a 30 bit sequence is generated by appending the six bit barker sequence to the end of the lower address part. The six bit barker sequence can be 001101 if the most significant bit is 0 or 110010 if the most significant bit is 1. The 30-bit sequence can then be logically XORed with a portion of a fixed 64-bit pseudo-noise (PN) sequence to generate a first codeword of 30-bits. The first codeword is then encoded with (64,30) block code to produce a 34-bit parity word. A second codeword is generated by appending the first codeword to the end of the 34-bit parity word. The second codeword is then XORed with the fixed 64-bit PN sequence to generate the sync word. The reconstructed sync word can then be compared with the bits corresponding to a sync word in the current bit block (1360). If the reconstructed sync word matches the sync word in the current bit block, the lower address part can be used as the device identifier (1370). Otherwise, if there is not a match between the sync words, the next bit block can be analyzed.

In one representative embodiment, the lower address part (LAP) is 24 bits from the MAC. Accordingly, like the MAC, the lower address part is also an anonymous identifier. The LAPs are not associated with any specific user account (as is the case with cell phone probes) or any specific vehicle (as with automated toll tags). The LAP is not linked to a specific person through any type of central database but is assigned at the Bluetooth electronic chip manufacturer. Additionally, it is difficult to match a LAP to the purchase of a device by a consumer. Thus, using the LAP within the described traffic management network minimizes, if not eliminates privacy concerns.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described representative embodiments focused on Bluetooth detection and ZigBee networking. The present invention, however, is not limited to detection of Bluetooth devices. Those skilled in the art will recognize that the device and methods of the present invention may be practiced using other connectivity detection means. Additionally, the networking can be done using other networking methods. Further, although a highway-type implementation is described, the system and method for a traffic management network can also be used in a city environment, warehouses, ports, terminals, etc. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for collecting traffic data, comprising:
    a first stationary data collection node comprising:
        a first networking communications module connected to a first processor;
        a first radio-frequency front end configured to:
            scan on non-pairing channels for data packets; and
            intercept a first data packet from an undiscoverable source from one of the non-pairing channels;
        a first cellular communications module connected to the first processor;
    a second stationary data collection node comprising:
        a second networking communications module connected to a second processor;
        a second radio-frequency front end configured to:
            scan on non-pairing channels for data packets; and
            intercept a second data packet from the undiscoverable source from one of the non-pairing channels;
        a second cellular communications module connected to the second processor;
        wherein the first and second data packets each comprise an access code, wherein each access code comprises a preamble and sync word, wherein each sync word comprises an encoded word, a lower address part, and a barker code;
    a central processing station linked to at least one of the first stationary data collection node and the second stationary data collection node via the cellular communications module comprising a packet search analyzer, wherein the packet search analyzer is configured to determine a first identifier from the first data packet and a second identifier from the second data packet, wherein the identifiers comprise the lower address part, wherein the identifiers identify the undiscoverable source, and wherein the central processing station is configured to determine traffic information by matching the first identifier and the second identifier.

2. The system of claim 1, wherein the first data packet or the second data packet is a bluetooth packet.

3. The system of claim 1, wherein the packet search analyzer is further configured to:
determine if the access code includes a valid preamble; and
determine if the sync word includes a valid barker code.

4. The system of claim 3, wherein the packet search analyzer is further configured to validate the sync word in the data packet if both the preamble and barker code are valid.

5. The system of claim 4, wherein the packet search analyzer is further configured to validate the sync word in at least one of the first data packet and the second data packet by reconstructing a sync word from the lower address part and barker code of the sync word.

6. The system of claim 1, wherein the traffic information comprises a time stamp.

7. The system of claim 1, wherein the central processing station is configured to calculate at least one of a speed associated with the identifier, a directionality associated with the identifier, and a travel time associated with the identifier.

8. The system of claim 7, further comprising an application server configured to determine traffic congestion of a road based on at least one the calculated speed, the calculated directionality, and the traffic travel time.

9. The system of claim 7, wherein the application server is configured to generate a traffic display indicating at least one of levels of congestion on the road, speed of traffic on the road, and travel time on the road.

10. The system of claim 7, further comprising an application server configured to:
receive the identifier and a node location;
match the identifier to a user identifier; and
associate the user identifier with the node location.

11. The system of claim 10, further comprising a display configured to indicate a location of an object based on the user identifier and the node location.

12. The system of claim 1, wherein the central processing station is configured to determine a lane collection associated with a vehicle based upon a received signal strength indicator of the at least one of the first data packet and the second data packet.

13. The system of claim 1, wherein the network is a wireless mesh based network.

14. The system of claim 7, wherein the at least one of a speed associated with the identifier, a directionality associated with the identifier, and a travel time associated with the identifier is determined by using multiple signal strength measurements.

15. The system of claim 7, wherein the central processing station is configured to use the at least one of a speed associated with the identifier, a directionality associated with the identifier, and a travel time to determine if the identifier is connected with a vehicle or a pedestrian.

16. The system of claim 13, wherein the wireless mesh based network is a cellular packet-based network.

17. The system of claim 13, wherein the wireless mesh based network is a mesh-cellular packet-based network.

* * * * *